US012562210B2

(12) United States Patent
Yoon et al.

(10) Patent No.: US 12,562,210 B2
(45) Date of Patent: Feb. 24, 2026

(54) VOLTAGE SUPPLY CIRCUIT, MEMORY DEVICE INCLUDING THE SAME, AND OPERATING METHOD OF MEMORY DEVICE

(71) Applicant: SAMSUNG ELECTRONICS CO., LTD., Suwon-si (KR)

(72) Inventors: Jayang Yoon, Suwon-si (KR); Chihyun Kim, Suwon-si (KR); Sangwan Nam, Suwon-si (KR); Chiweon Yoon, Suwon-si (KR); Hyeongdo Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 121 days.

(21) Appl. No.: 18/404,411

(22) Filed: Jan. 4, 2024

(65) Prior Publication Data

US 2024/0233804 A1 Jul. 11, 2024

(30) Foreign Application Priority Data

Jan. 5, 2023 (KR) ........................ 10-2023-0001941

(51) Int. Cl.
*G11C 5/14* (2006.01)
*G11C 11/4074* (2006.01)
*G11C 11/4076* (2006.01)
*G11C 11/4099* (2006.01)

(52) U.S. Cl.
CPC ...... *G11C 11/4074* (2013.01); *G11C 11/4076* (2013.01); *G11C 11/4099* (2013.01)

(58) Field of Classification Search
CPC ............ G11C 11/4074; G11C 11/4076; G11C 11/4099

USPC .......................................................... 365/226
See application file for complete search history.

(56) References Cited

U.S. PATENT DOCUMENTS

| | | | | |
|---|---|---|---|---|
| 6,128,242 A | * | 10/2000 | Banba | G11C 16/30 |
| | | | | 365/226 |
| 6,449,208 B1 | * | 9/2002 | Kono | G11C 29/12 |
| | | | | 365/201 |
| 6,480,419 B2 | * | 11/2002 | Lee | G11C 16/24 |
| | | | | 365/204 |
| 6,597,603 B2 | | 7/2003 | Lambrache et al. | |
| 6,798,275 B1 | * | 9/2004 | Le | G11C 8/08 |
| | | | | 327/536 |

(Continued)

FOREIGN PATENT DOCUMENTS

JP 2007-58972 A 3/2007

OTHER PUBLICATIONS

Communication issued on Apr. 26, 2024 by the European Patent Office for European Patent Application No. 24150148.5.

*Primary Examiner* — Viet Q Nguyen
(74) *Attorney, Agent, or Firm* — Sughrue Mion, PLLC

(57) ABSTRACT

Disclosed is a memory device in which at least one word line or bit line is charged by a plurality of charging terminals. The memory device includes a first charging terminal for supplying a first voltage to the at least one word line or bit line, and a second charging terminal for suppling a second voltage to the at least one word line or bit line when voltage supply by the first charging terminal is completed. The supply of the second voltage starts when a charged voltage of the at least one word line or bit line, charged by using the first voltage, satisfies a first reference condition.

20 Claims, 17 Drawing Sheets

(56)                References Cited

U.S. PATENT DOCUMENTS

| | | | | |
|---|---|---|---|---|
| 7,251,153 | B2 * | 7/2007 | Sakai | G11C 11/22 |
| | | | | 365/189.04 |
| 7,474,563 | B2 * | 1/2009 | Hsu | G11C 16/10 |
| | | | | 365/185.2 |
| 7,639,540 | B2 | 12/2009 | Kim et al. | |
| 7,755,963 | B2 * | 7/2010 | Kang | G11C 7/08 |
| | | | | 365/207 |
| 7,764,569 | B2 | 7/2010 | Chen | |
| 7,920,438 | B2 * | 4/2011 | Yamaoka | G11C 29/028 |
| | | | | 365/189.11 |
| 8,018,786 | B2 * | 9/2011 | Parkinson | G11C 13/004 |
| | | | | 365/189.14 |
| 8,116,152 | B2 * | 2/2012 | Kaku | G11C 8/18 |
| | | | | 365/194 |
| 8,964,488 | B2 | 2/2015 | Kim et al. | |
| 8,982,615 | B2 * | 3/2015 | Conte | G11C 8/12 |
| | | | | 365/163 |
| 9,543,032 | B2 | 1/2017 | Kang et al. | |
| 9,576,675 | B2 | 2/2017 | Kim et al. | |
| 9,893,614 | B2 * | 2/2018 | Tagliavia | H02M 3/155 |
| 9,966,127 | B2 * | 5/2018 | Bedeschi | G11C 11/2259 |
| 10,050,518 | B2 | 8/2018 | Lim et al. | |
| 10,510,383 | B2 * | 12/2019 | Tseng | G11C 16/08 |
| 11,600,328 | B2 * | 3/2023 | Shimizu | G11C 16/24 |
| 11,636,896 | B2 * | 4/2023 | Su | G11C 13/003 |
| | | | | 365/230.06 |
| 11,984,151 | B2 * | 5/2024 | Rawat | G11C 7/12 |
| 2005/0201140 | A1 * | 9/2005 | Chow | G11C 11/22 |
| | | | | 365/145 |
| 2015/0009745 | A1 * | 1/2015 | Nguyen | G11C 13/0007 |
| | | | | 365/148 |
| 2018/0204625 | A1 | 7/2018 | Hioka | |
| 2019/0006020 | A1 * | 1/2019 | Sundaresan | G11C 29/12005 |
| 2021/0050037 | A1 | 2/2021 | Kang et al. | |
| 2021/0358553 | A1 | 11/2021 | Yang et al. | |

* cited by examiner

VOLTAGE SUPPLY CIRCUIT, MEMORY DEVICE INCLUDING THE SAME, AND OPERATING METHOD OF MEMORY DEVICE

CROSS-REFERENCE TO RELATED APPLICATION

This application is based on and claims priority under 35 U.S.C. § 119 to Korean Patent Application No. 10-2023-0001941, filed on Jan. 5, 2023, in the Korean Intellectual Property Office, the disclosure of which is incorporated by reference herein in its entirety.

BACKGROUND

1. Field

Embodiments of the disclosure relate to a voltage supply circuit, a memory device including the voltage supply circuit, and an operating method of the memory device, and more particularly, to a method of charging a word line or a bit line of the memory device.

2. Description of Related Art

Recently, memory devices have been developed in the form of a three-dimensional device. As the number of stacked layers for the cell array increases in a 3D memory device, the charging capacity also increases.

In a related art method of charging word lines or bit lines in a memory device, a voltage having a constant value is applied to the word lines or the bit lines. However, when the constant voltage is continuously applied, power consumption for charging word lines or bit lines is increased.

Thus, in order to solve the above-described problem and/or other problems, it is necessary to develop a new technology for reducing power consumption in charging word lines or bit lines of a memory device.

SUMMARY

Embodiments of the disclosure provide a method of charging word lines or bit lines in which various constant voltages are applied in multiple charging stages, respectively.

By applying voltages having different sizes at their own charging stages, an embodiment of the disclosure discloses a memory device for reducing the power consumption for charging the word lines or the bit lines.

According to an aspect of the disclosure, there is provided a memory device including: a first charging terminal configured to supply a first voltage to at least one word line or the at least one bit line; and a second charging terminal configured to supply a second voltage to the at least one word line or the at least one bit line based on voltage supply by the first charging terminal being completed, wherein the second charging terminal is configured to start supplying the second voltage based on a charged voltage of the at least one word line or the at least one bit line charged based on the first voltage satisfying a first reference condition.

According to another aspect of the disclosure, there is provided an operating method of a memory device, the method including: supplying, by a first charging terminal, a first voltage to at least one word line or at least one bit line; and supplying, by a second charging terminal a second voltage to the at least one word line or the at least one bit line, wherein supply of the second voltage starts based on a charged voltage of the at least one word line or the at least one bit line, charged based on the first voltage, satisfying a first reference condition.

According to another aspect of the disclosure, there is provided a voltage supply circuit of a memory device, the voltage supply circuit including: a first charging terminal configured to supply a first voltage to at least one word line or the at least one bit line; a second charging terminal configured to supply a second voltage to the at least one word line or the at least one bit line based on supply of the first voltage by the first charging terminal being stopped, wherein the second charging terminal is configured to start supplying the second voltage starts based on a charged voltage of the at least one word line or the at least one bit line charged based on the first voltage satisfying a first reference condition.

BRIEF DESCRIPTION OF DRAWINGS

Embodiments will be more clearly understood from the following detailed description taken in conjunction with the accompanying drawings in which;

FIGS. 14 and 15 are views illustrating a memory block of a memory device, according to an embodiment; and FIGS. 16 and 17 are views illustrating a 3-dimensional V-NAND structure applicable to a memory device, according to an embodiment.

DETAILED DESCRIPTION

Figure 1:
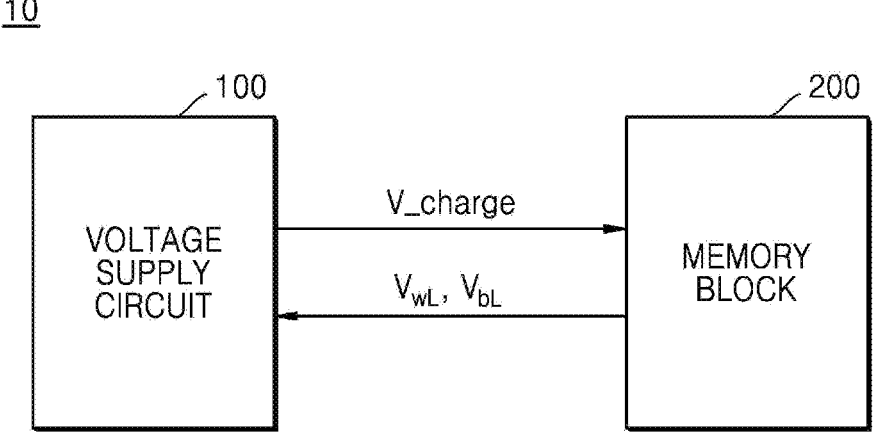
FIG. 1 is a block diagram showing a memory device 10, according to an embodiment.

All terms used herein are briefly described and embodiments of the disclosure are described fully hereinafter. These embodiments are example embodiments, and thus, the disclosure is not limited thereto and may be realized in various other forms. As is traditional in the field, embodiments may be described and illustrated in terms of blocks, as shown in the drawings, which carry out a described function or functions. These blocks, which may be referred to herein as units or modules or the like, or by names such as device, logic, circuit, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein).

FIG. 1 is a block diagram showing a memory device 10, according to an embodiment.

Referring to FIG. 1, a memory device 10 according to an embodiment may include a voltage supply circuit 100 and a memory block 200.

In an embodiment, the voltage supply circuit 100 may supply a charging voltage V_charge to the memory block. For example, the voltage supply circuit 100 may supply various charging voltages having different values V_charge to the memory block 200 in multiple charging stages, respectively. In an example, the multiple charging stages may be referred to as charging steps. In an embodiment, the voltage supply circuit 100 may charge at least one selected word line or at least one selected bit line, which is selected among a plurality of word lines or a plurality of bit lines in the memory block 200. For example, the voltage supply circuit 100 may include a plurality of charging terminals, and the at least one selected word line or the at least one selected bit line may be charged by using a corresponding charging terminal, among the plurality of charging terminals. Detailed configurations of the voltage supply circuit 100 are described with reference to FIG. 2.

In an embodiment, the memory block 200 may include the plurality of word lines and the plurality of bit lines. In an embodiment, the memory block 200 may transmit an increased word line voltage VwL or an increased bit line voltage VbL to the voltage supply circuit 100. The increased word line voltage VwL or the increased bit line voltage VbL may be increased by the charging voltage V_charge.

The memory device 10 having the memory block 200 according to an embodiment may include a volatile memory, such as static random access memory (SRAM), dynamic random access memory (DRAM), latch, flip-flop, register, and the like and a nonvolatile memory, such as NAND flash memory, vertical NAND (VNAND) flash memory, NOR flash memory, resistive random access memory (RRAM), phase-change memory (PRAM), magnetoresistive random access memory (MRAM), ferroelectric random access memory (FRAM), spin transfer torque random access memory (STT-RAM), and the like.

Figure 2:
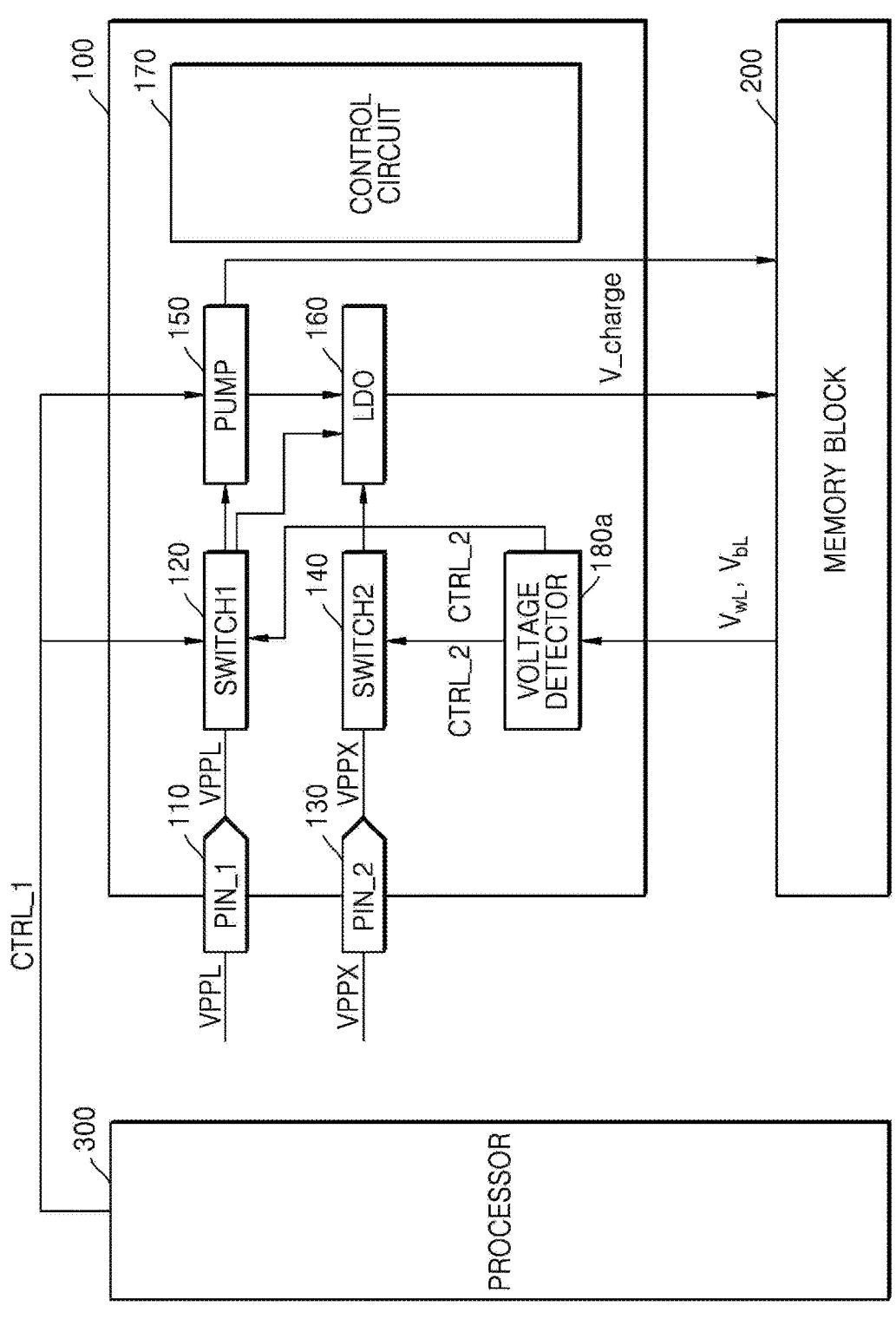
FIG. 2 is a block diagram showing a voltage supply circuit of a memory device, according to an embodiment.

FIG. 2 is a block diagram showing the voltage supply circuit 100 of the memory device 10 shown in FIG. 1, according to an embodiment.

Referring to FIG. 2, the voltage supply circuit 100 according to an embodiment may include a first charging terminal (PIN_1) 110, a first switch (SWITCH1) 120, a second charging terminal (PIN_1) 130, and a second switch (SWITCH1) 140. In addition, the voltage supply circuit 100 may include a voltage pump (PUMP) 150, a linear regulator (LDO) 160, a control logic circuit 170, and a voltage detector 180a.

In an embodiment, the first charging terminal 110 may supply a first voltage VPPL to at least one selected word line or at least one selected bit line from outside the voltage supply circuit 100. In an embodiment, the first charging terminal 110 may supply the first voltage VPPL to the at least one selected word line or the at least one selected bit line from outside the memory device 10.

In an embodiment, the first switch 120 may be electrically connected to the first charging terminal 110 and may control the supply of the first voltage VPPL. For example, when the charging result of at least one word line or at least one bit line by using the first voltage VPPL is determined to satisfy a first reference condition, the first switch 120 may be opened and the first voltage VPPL may not be supplied any more. For example, when the charging result of at least one word line or at least one bit line by using the first voltage VPPL is determined to satisfy the first reference condition, the first switch 120 may be opened and supply of the first voltage VPPL to the at least one word line or the at least one bit line may be stopped. The first reference condition may be a preset condition or a predetermined condition. In an embodiment, the first reference condition may be set as a state, in which, the at least one selected word line or the at least one selected bit line, which is selected among the plurality of word lines or the plurality of bit lines for charging, has a same voltage as the first voltage VPPL. In an embodiment, the first switch 120 may be controlled to be open or close based on to a first control signal CTRL_1 or a second control signal CTRL_2.

When the voltage supply by the first charging terminal 110 is completed, the second charging terminal 130 may supply a second voltage VPPX to the at least one selected word line or the at least one selected bit line from outside the voltage supply circuit 100. In an embodiment, the second charging terminal 130 may supply the second voltage VPPX to the at least one selected word line or the at least one selected bit line from outside the memory device 10.

In an embodiment, the second switch 140 may be electrically connected to the second charging terminal 130 to control the supply of the second voltage VPPX. For example, when the charging result of at least one word line or at least one bit line by using the second voltage VPPX is determined to satisfy a second reference condition, the second switch 120 may be opened and the second voltage VPPX may not be supplied any more. The second reference condition may be a preset condition or a predetermined condition. In an embodiment, the second reference condition may be set as a state, in which, the at least one selected word line or the at least one selected bit line, which is selected among the plurality of word lines or the plurality of bit lines for charging, has a same voltage as the second voltage VPPX. In an embodiment, the second switch 140 may be controlled to be open or close based on the second control signal CTRL_2.

The first voltage VPPL and the second voltage VPPX may be different from each other. For example, the second voltage VPPX may be greater than the first voltage VPPL. In an embodiment, the first voltage VPPL may be half the second voltage VPPX, but the values of the first voltage VPPL and the second voltage VPPX are not limited thereto. In addition, although only the first voltage VPPL and the second voltage VPPX are described herein, the voltage supply circuit 100 may charge the memory block 200 by using a plurality of additional voltages VPPn (where n is an integer greater than 1). When the memory block 200 is charged by using the additional voltages VPPn, the voltage supply circuit 100 may include n additional charging terminals.

In an embodiment, the voltage pump 150 and the linear regulator 160 may adjust the charging voltage V_charge that is applied to the memory block 200. For example, the voltage pump 150 may receive the first control signal CTRL_1 and provide the first voltage VPPL to the linear regulator 160 or the memory block 200 based on the first control signal CTRL_1. In an embodiment, the linear regulator 160 may receive the first voltage VPPL and transmit the received first voltage VPPL to the memory block 200 as the constant charging voltage V_charge. In addition, the linear regulator 160 may receive the first voltage VPPL or the second voltage VPPX and transmit the received second voltage VPPX to the memory block 200 as the constant charging voltage V_charge.

In an embodiment, the control logic circuit 170 may store various control logic for the voltage supply by the first charging terminal 110 or the second charging terminal 130 and may control the first switch 120 or the second switch 140 based on the stored control logic. For example, the control logic circuit 170 may store information on the first reference condition for the supply of the first voltage VPPL and the second reference condition for the supply of the second voltage VPPX.

In an embodiment, the voltage detector 180a may receive the increased word line voltage VwL of the at least one selected word line or the increased bit line voltage VbL of the at least one selected bit line from the memory block 200 and determine whether the increased word line voltage VwL or the increased bit line voltage VbL satisfies the first reference condition or the second reference condition. When the increased word line voltage VwL or the increased bit line voltage VbL satisfies the first reference condition, the voltage detector 180a may generate the second control signal CTRL_2. The voltage detector 180a may generate the second control signal CTRL_2 and control the first switch 120 to be open (i.e., switch off) and the second switch 140 to be close (i.e., switch on) by using the second control signal CTRL_2, to thereby charge the at least one selected word line or the at least one selected bit line by using the second voltage VPPX. When the increased word line voltage VwL of the at least one selected word line or the increased bit line voltage VbL of the at least one selected bit line satisfies the second reference condition, the voltage detector 180a may generate the second control signal CTRL_2 and control the second switch 140 to be open (i.e., switch off) by using the second control signal CTRL_2. That is, the voltage detector 180a may control the supply of the first voltage VPPL and the second voltage VPPX by detecting the increased word line voltage VwL of the at least one word line or the increased bit line voltage VbL of the at least one bit line.

In an embodiment, the memory block 200 may transmit the increased word line voltage VwL or the increased bit line voltage VwL, which is increased by the charging voltage V_charge, to the voltage supply circuit 100.

In an embodiment, the memory device 10 may further include a processor 300 that is configured to generate a control signal with respect to the voltage supply circuit 100. For example, the processor may generate the control signal to control the voltage supply circuit 100 based on the control logic circuit 170. For example, the processor 300 may generate the first control signal CTRL_1 and control the first switch 120 and the voltage pump 150 to supply the first voltage VPPL by using the first control signal CTRL_1. Although FIG. 2 shows that the processor 300 generates only the first control signal CTRL_1, the control signals generated by the processor 300 are not limited thereto, and the processor 300 may generate various signals related to various operations of the voltage supply circuit 100 (e.g., control signals for controlling various operations of the voltage supply circuit 100). In addition, the processor 300 may generate various control logic and the control logic may be stored in the control logic circuit 170. For example, the processor 300 may control the operation of the voltage supply circuit 100 based on the control logic. In addition, although FIG. 2 shows that the process 300 is provided outside the voltage supply circuit 100, the processor 300 may also be positioned inside the voltage supply circuit 100. The same configurations as described above is also applied to the voltage supply circuit 100 described with reference to FIGS. 4 and 6.

Figure 3:
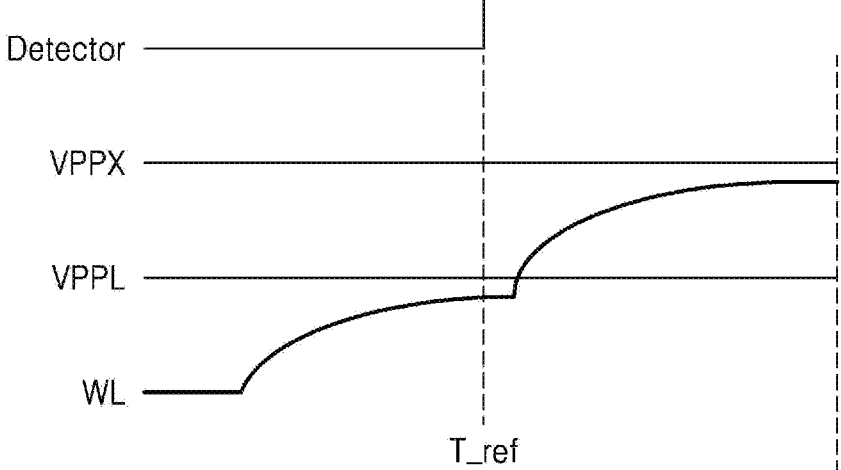
FIG. 3 is a timing diagram illustrating voltage supply in multiple charging stages in an operating method of a memory device, according to an embodiment.

FIG. 3 is a timing diagram illustrating the voltage supply in multiple charging stages in a method of operating the memory device, according to an embodiment.

FIG. 3 shows signal timings in a case that a word line WL of the memory device is charged in the method of operating the memory device according to an embodiment. However, the disclosure is not limited thereto, and as such, according to another embodiment, the same signal timings as shown in FIG. 3 may be applied in a case that the bit line is charged. Referring to FIG. 3, at least one selected word line WL, which is selected among the plurality of word lines, may be charged based on the first voltage VPPL and the second voltage VPPX. For example, when the charging result of the at least one selected word line or the at least one selected bit line by using the first voltage VPPL is determined to satisfy the preset first reference condition, the first voltage VPPL may not be supplied any more (e.g., the first voltage VPPL stops). In an embodiment, the first reference condition may be set as a state, in which, the at least one selected word line or the at least one selected bit line, which is selected among the plurality of word lines or the plurality of bit lines for charging, has a same voltage as the first voltage VPPL. However, the disclosure is not limited thereto, and as such, according to another embodiment, the first reference condition may be set in a different manner. For example, the first reference condition may be set as a state, in which, the at least one selected word line or the at least one selected bit line, which is selected among the plurality of word lines or the plurality of bit lines for charging, may have a voltage within a range of the first voltage VPPL.

In an embodiment, after a period of time passes a reference time T_ref at which the charging result satisfies the first reference condition, the voltage supply circuit 100 may charge the at least one selected word line or the at least one selected bit line by using the second voltage VPPX.

In an embodiment, detecting results (i.e., "Detector") of the voltage detector 180a may be changed from the reference time T_ref at which the first reference condition is satisfied. For example, the voltage detector 180a may detect a low level voltage of a selected word line in a time interval when the selected word line is charged by using the first voltage VPPL, and may detect a high level voltage of the selected word line in another time interval when the selected word line is charged by using the second voltage VPPX.

Figure 4:
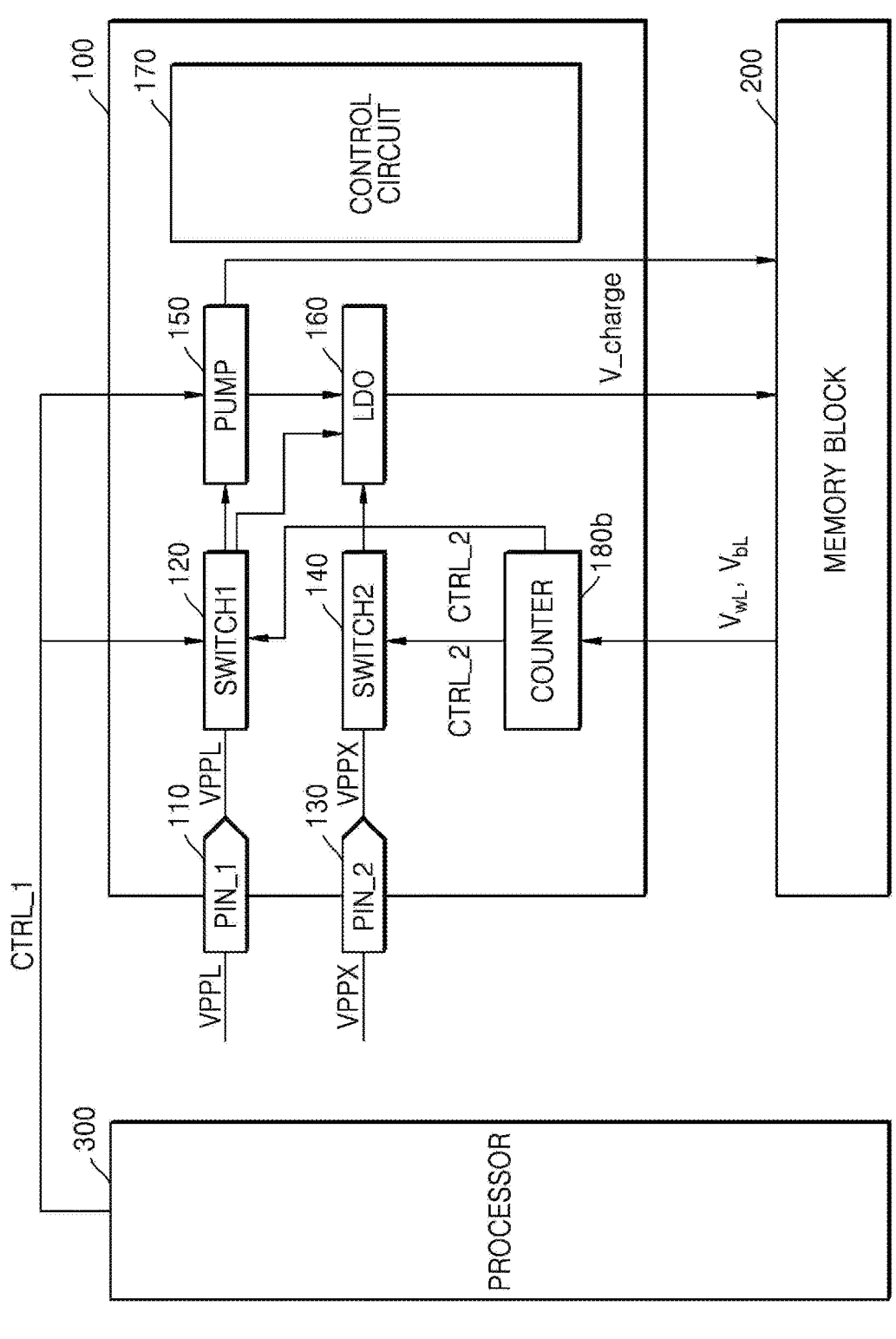
FIG. 4 is a block diagram showing a voltage supply circuit of a memory device, according to an embodiment.

FIG. 4 is a block diagram showing the voltage supply circuit 100 of the memory device 10 including a counter, according to an embodiment.

Referring to FIG. 4, the voltage supply circuit 100 according to an embodiment may include the first charging terminal 110, the first switch 120, the second charging terminal 130, the second switch 140, the voltage pump 150, the linear regulator 160, and the control logic circuit 170 each having the same configuration and operation as described in detail with reference to FIG. 2. However, the voltage supply circuit 100 in FIG. 4 may further include a counter 180b. Hereinafter, the operation of the voltage supply circuit 100 is described with focus given to an operation of the counter 180*b*.

According to an embodiment, the counter 180*b* may count a supply time in which the first voltage VPPL and the second voltage VPPX are supplied. When the first voltage VPPL is determined to be supplied to the at least one selected word line or the at least one selected bit line for a preset supply time, the voltage supply circuit 100 may supply the second voltage VPPX and the memory block 200 may be charged by using the second voltage VPPX. In an embodiment, the preset supply time may be set as a supply time in which the at least one selected word line or the at least one selected bit line has the same voltage as the first voltage VPPL but is not limited thereto.

For example, when the counter 180*b* counts an actual supply time in which the first voltage VPPL is actually supplied and the actual supply time of the first voltage VPPL is determined to satisfy the preset supply time, the voltage supply circuit 100 may charge the memory block 200 based on the second voltage VPPX.

In an embodiment, when the preset supply time is not sufficient for the time when the at least one selected word line or the at least one selected bit line has the same voltage as the first voltage VPPL, the voltage supply circuit 100 may supply the second voltage VPPX until a voltage of the at least one selected word line or the at least one selected bit line satisfies the second reference condition. In an embodiment, the second reference condition may be set as a state that the at least one a selected word line or the at least one selected bit line, which is selected among the plurality of word lines or the plurality of bit lines for charging, has the same voltage as the second voltage VPPX.

Figure 5:
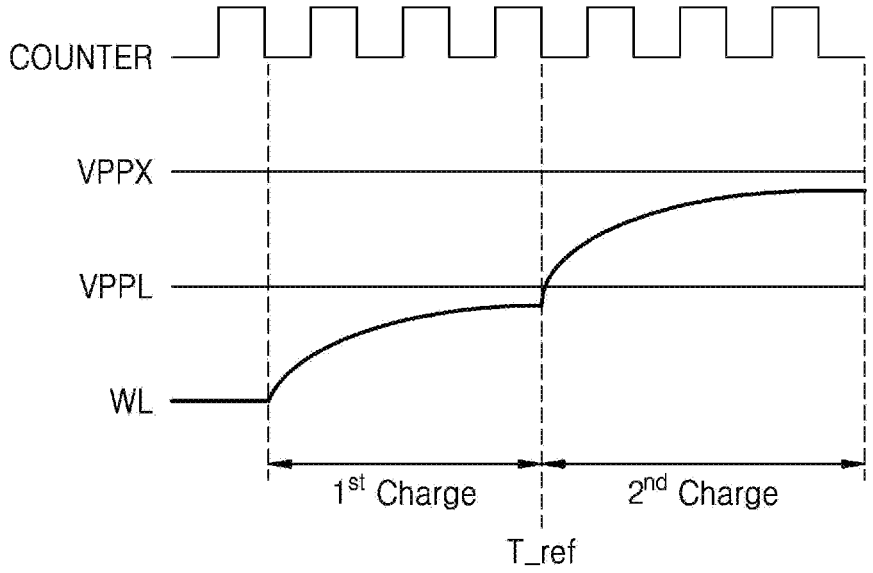
FIG. 5 is a timing diagram showing voltage supply in multiple charging stages over time in an operating method of a memory device, according to an embodiment.

FIG. 5 is a timing diagram showing the voltage supply in multiple charging stages over times in the method of operating the memory device, according to an embodiment. FIG. 5 shows signal timings in a case that a word line WL of the memory device is charged in the method of operating the memory device according to an embodiment, however, the same signal timings as shown in FIG. 5 are found in a case that the bit line is charged.

Referring to FIG. 5, the voltage supply circuit 100 may supply the first voltage VPPL to the at least one selected word line or the at least one selected bit line in a first charging section 1st Charge and may supply the second voltage VPPX to the at least one selected word line or the at least one selected bit line in a second charging section 2nd charge. In an embodiment, the first charging section 1st Charge or the second charging section 2nd Charge may be determined based on a preset time. The preset time may be determined by a user input or may be determined as a time when the at least one selected word line or the at least one selected bit line has the same voltage as the first voltage VPPL but is not limited thereto.

In an embodiment, when the preset time elapses, the voltage supply circuit 100 may terminate the first charging section 1st Charge and start the second charging section 2nd Charge. For example, the voltage supply circuit 100 may terminate the first charging section 1st Charge and start the second charging section 2nd Charge at a reference time T_ref at which the first reference condition is satisfied.

Figure 6:
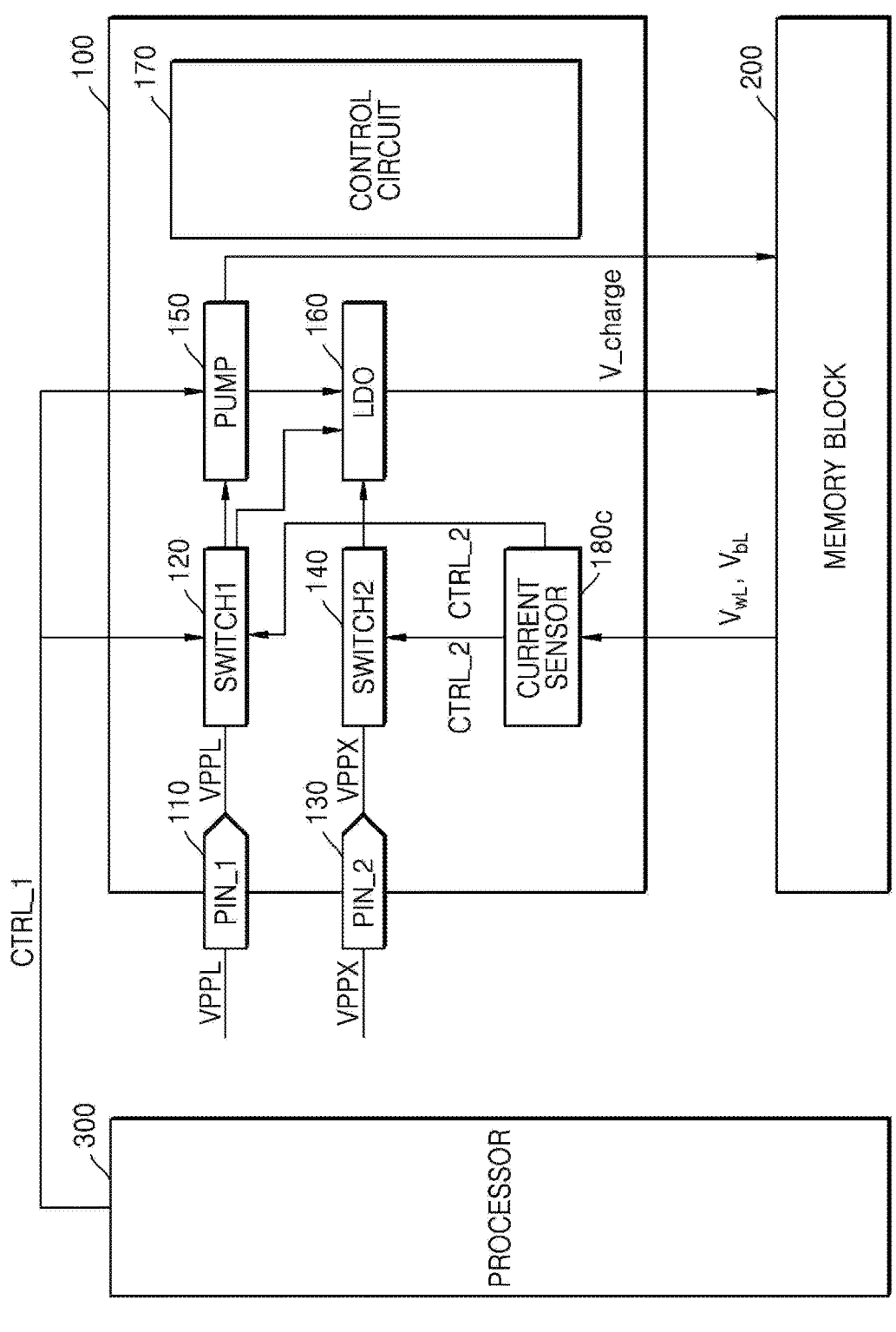
FIG. 6 is a block diagram showing a voltage supply circuit of a memory device, according to an embodiment.

FIG. 6 is a block diagram showing a voltage supply circuit of a memory device, according to an embodiment.

Referring to FIG. 6, the voltage supply circuit 100 according to an embodiment may include the first charging terminal 110, the first switch 120, the second charging terminal 130, the second switch 140, the voltage pump 150, the linear regulator 160, and the control logic circuit 170 each having the same configuration and operation as described in detail with reference to FIGS. 2 and 4. However, the voltage supply circuit 100 in FIG. 6 may further include a current sensor 180*c*. Hereinafter, the operation of the voltage supply circuit 100 is described with focus given to an operation of the current sensor 180*c*.

Referring to FIG. 6, the current sensor 180*c* according to an embodiment may detect intensity of an electric current passing through the first switch 120 and the second switch 140. In an embodiment, when the intensity of a first current passing through the first switch 120 is determined to satisfy a first reference current, the voltage supply circuit 100 may be configured to supply the second voltage VPPX. The first reference current may be a preset current value or a predetermined current value. In an embodiment, the first current may be an electric current generated by the first voltage VPPL and passing in the first switch 120. In an embodiment, the first reference current may be a value at which the supply amount of the first voltage VPPL or the second voltage VPPX, which is determined based on average intensity of the first current or the second current, satisfies the first reference condition or the second reference condition, respectively.

In an embodiment, the current sensor 180*c* may detect the average intensity of the current passing in the first switch 120 and the second switch 140. When the second voltage VPPX is supplied based on the average intensity of the current passing through the first switch 120 and the second switch 140, the voltage supply circuit 100 may be configured to supply the second voltage VPPX when the average intensity of the first current is determined to satisfy the first reference current. For example, the voltage supply circuit may determine that the first voltage VPPL is sufficiently supplied in a degree that the first reference condition is satisfied by detecting results of the average intensity of the first current and may start the supply of the second voltage VPPX. In an embodiment, the voltage supply circuit 100 may determine the supply amount of the first voltage VPPL based on the average intensity of the first current.

In an embodiment, when the average intensity of the second current of the second switch 140 is determined to satisfy the first reference current, the voltage supply circuit 100 may stop the supply of the second voltage VPPX. Herein, the second current may be an electric current generated by the second voltage VPPX and flowing in the second switch 140. When the supply of the first voltage VPPL is stopped and at least one word line or at least one bit line, which is selected based on the second voltage VPPX, is charged, the voltage supply circuit 100 may determine that the second voltage VPPX is sufficiently supplied in such a degree that the second reference condition is satisfied by the detecting results of the average intensity of the second current, and may stop the supply of the second voltage VPPX. In an embodiment, the voltage supply circuit 100 may determine the supply amount of the second voltage VPPX based on the average intensity of the second current.

In an embodiment, the current sensor 180*c* may detect a maximum current of the first switch 120 and a maximum current of the second switch 140. In an embodiment, when a maximum value of the first current detected by the current sensor 180*c* is determined to satisfy a second reference current, the voltage supply circuit 100 may control the second voltage VPPX to be supplied to the selected word line or the selected bit line. The second reference current may be a preset current or a predetermined current. In addition, when a maximum value of the second current of the second switch 140 is determined to satisfy the preset second reference current, the voltage supply circuit 100 may stop the supply of the second voltage VPPX.

In an embodiment, the second reference current may be a value at which the supply amount of the first voltage VPPL or the second voltage VPPX, which is determined based on the maximum (or peak) intensity of the first current or the second current, satisfies the first reference condition or the second reference condition, respectively.

Figure 7:
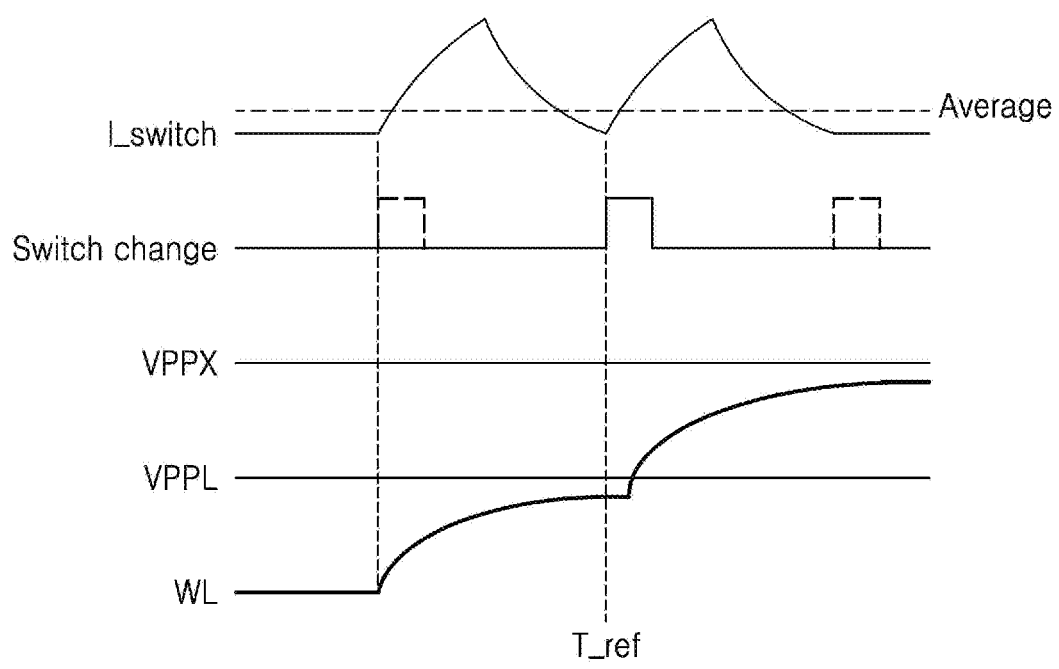
FIGS. 7 and 8 are timing diagrams showing voltage supply in multiple charging stages according to the intensity of current in an operating method of a memory device, according to an embodiment.
Figure 8:
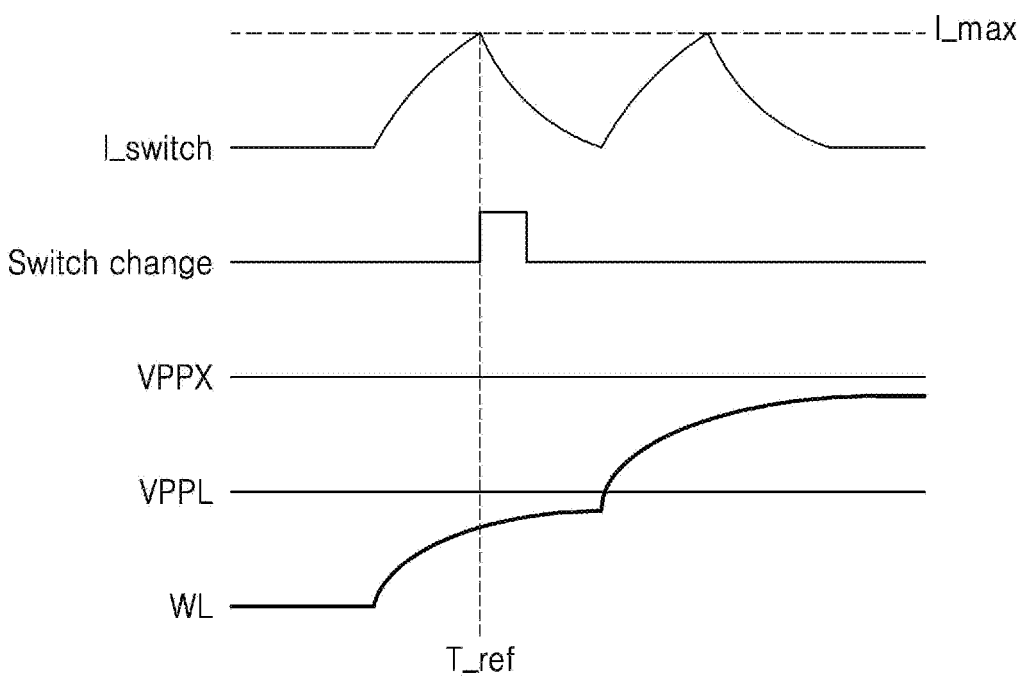

FIGS. 7 and 8 are timing diagrams showing the voltage supply in multiple charging stages according to the intensity of current in a method of operating a memory device, according to an embodiment.

Referring to FIG. 7, the voltage supply circuit 100 may control operations of the first switch 120 and the second switch 140 based on the average intensity of the first current and the second current. In an embodiment, the voltage supply circuit 100 may supply the first voltage VPPL up to the reference time T_ref at which the first voltage VPPL satisfies the first reference condition. For example, when the average intensity of the first current is determined to satisfy the first reference current, the voltage supply circuit 100 may determine that the first reference condition is satisfied. Thus, the voltage supply circuit 100 may determine that the first voltage VPPL is sufficiently supplied in a degree that the first reference condition is satisfied by the detecting results of the average intensity of the first current, and then, the voltage supply circuit 100 may generate a switch change signal (Switch change) to start the supply of the second voltage VPPX.

In an embodiment, when the average intensity of the second current of the second switch 140 is determined to satisfy the preset first reference current, the voltage supply circuit 100 may stop the supply the second voltage VPPX. When the supply of the first voltage VPPL is stopped and at least one word line or at least one bit line, which is selected based on the second voltage VPPX, is charged, the voltage supply circuit 100 may determine that the second voltage VPPX is sufficiently supplied in such a degree that the second reference condition is satisfied by the detecting results of the average intensity of the second current, and may stop the supply of the second voltage VPPX. The voltage supply circuit 100 may determine the supply amount of the second voltage VPPX based on the average intensity of the second current.

Referring to FIG. 8, the voltage supply circuit 100 may detect a maximum current I_max at the first switch 120 and the second switch 140. In an embodiment, when the maximum value of the first current, which is detected by the current sensor 180c, is determined to satisfy the second reference current, the voltage supply circuit 100 may determine that the first reference condition is satisfied. In an embodiment, the voltage supply circuit 100 may generate the switch change signal Switch change at a reference time T_ref at which the first reference condition is satisfied and may control the second voltage VPPX to be supplied to the selected word line or the selected bit line. In addition, when the maximum value of the second current of the second switch 140 is determined to satisfy the second reference current, the voltage supply circuit 100 may stop the supply of the second voltage VPPX.

For example, the second reference current may be a value at which the supply amount of the first voltage VPPL or the second voltage VPPX, which is determined based on the maximum (or peak) intensity of the first current or the second current, satisfies the first reference condition or the second reference condition, respectively.

Figure 9:
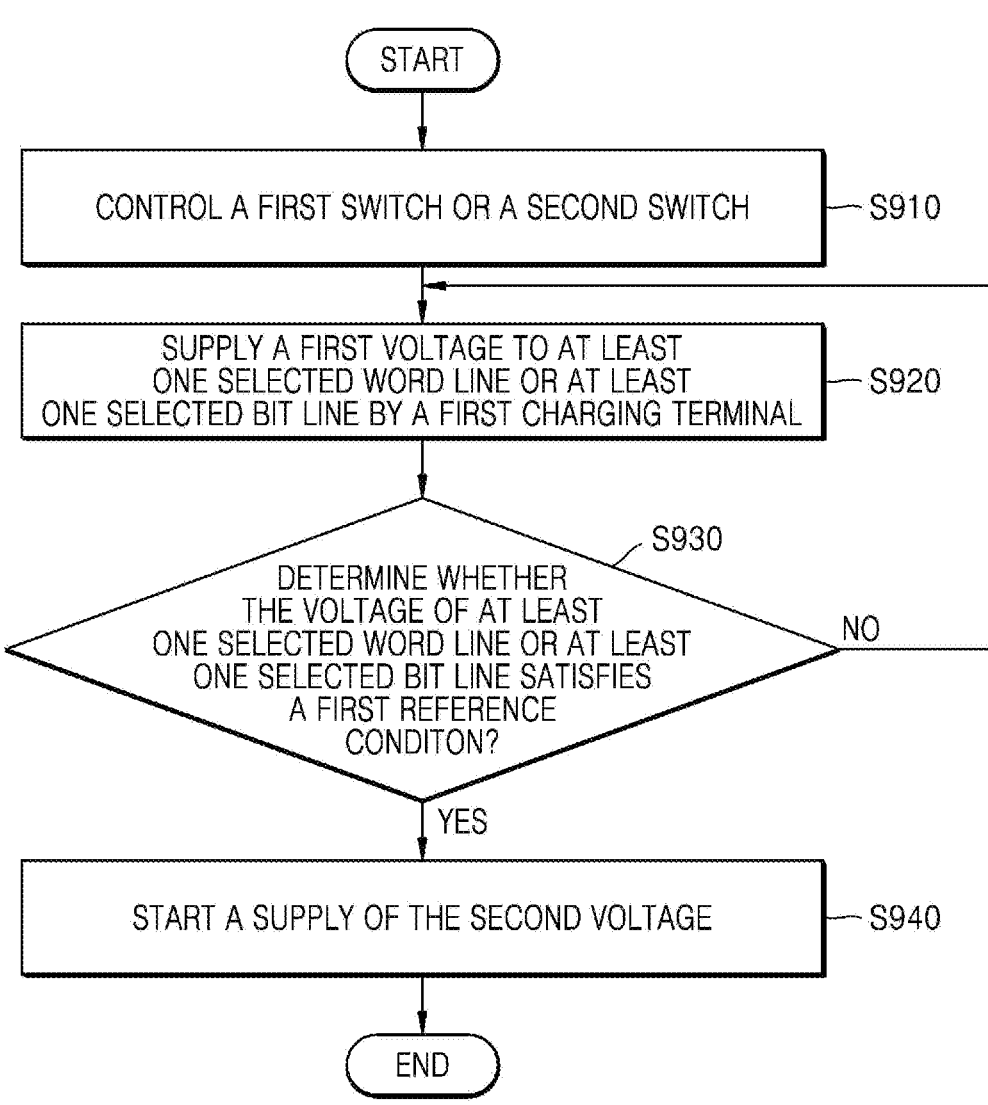
FIG. 9 is a flowchart showing an operating method of a memory device, according to an embodiment.

FIG. 9 is a flowchart showing a method of operating a memory device, according to an embodiment.

Referring to FIG. 9, the memory device 10 according to an embodiment may control the first switch 120 and the second switch 140 to charge at least one selected word line or at least one selected bit line among a plurality of word lines or a plurality of bit lines by using the plurality of charging terminals (S910).

In an embodiment, the memory device 10 may supply the first voltage VPPL to at least one selected word line or at least one selected bit line via the first charging terminal 110 (S920).

Thus, the memory device 10 may control the supply of the first voltage VPPL by the first switch 120. For example, when the charging result of at least one word line or at least one bit line by using the first voltage VPPL is determined to satisfy the preset first reference condition, the first switch 120 may be opened and the first voltage VPPL may no longer be supplied.

When the first voltage VPPL is supplied to at least one selected word line or at least one selected bit line via the first charging terminal 110, the memory device 10 may determine whether the voltage of at least one selected word line or at least one selected bit line satisfies the first reference condition (S930). For example, the first reference condition may be set as a state that a selected word line or a selected bit line for the charging, which is selected among the plurality of word lines or the plurality of bit lines, has the same voltage as the first voltage VPPL.

When the charging voltage of at least one selected word line or at least one selected bit line is determined to satisfy the first reference condition, the memory device 10 may start the supply of the second voltage to the at least one selected word line or the at least one selected bit line (S940).

When the voltage supply via the first charging terminal 110 is completed, the memory device 10 may supply the second voltage VPPX to the at least one selected word line or the at least one selected bit line.

However, when the charging voltage of at least one selected word line or at least one selected bit line is not determined to satisfy the first reference condition, the memory device 10 may continue to supply the first voltage VPPL to the at least one selected word line or the at least one selected bit line via the first charging terminal 110.

In an embodiment, the memory device 10 may control the supply of the second voltage VPPX by controlling the second switch 140. For example, when the charging result of at least one word line or at least one bit line by using the second voltage VPPX is determined to satisfy the preset second reference condition, the second switch 120 may be opened and the second voltage VPPX may not be supplied any more. For example, the second reference condition may be set as a state that a selected word line or a selected bit line for the charging, which is selected among the plurality of word lines or the plurality of bit lines, has the same voltage as the second voltage VPPX.

In an embodiment, the first voltage VPPL and the second voltage VPPX may be configured to have different values. For example, the second voltage VPPX may be set as a value greater than the first voltage VPPL. In an embodiment, the first voltage VPPL may be half the second voltage VPPX, but the first voltage VPPL and the second voltage VPPX are not limited thereto. In addition, although only the first voltage VPPL and the second voltage VPPX are described herein, the memory device 10 may charge the memory block 200 by using an additional plurality of voltages VPPn. When the memory block 200 is charged by using the additional voltages VPPn, the memory device 10 may include n charging terminals.

Figure 10:
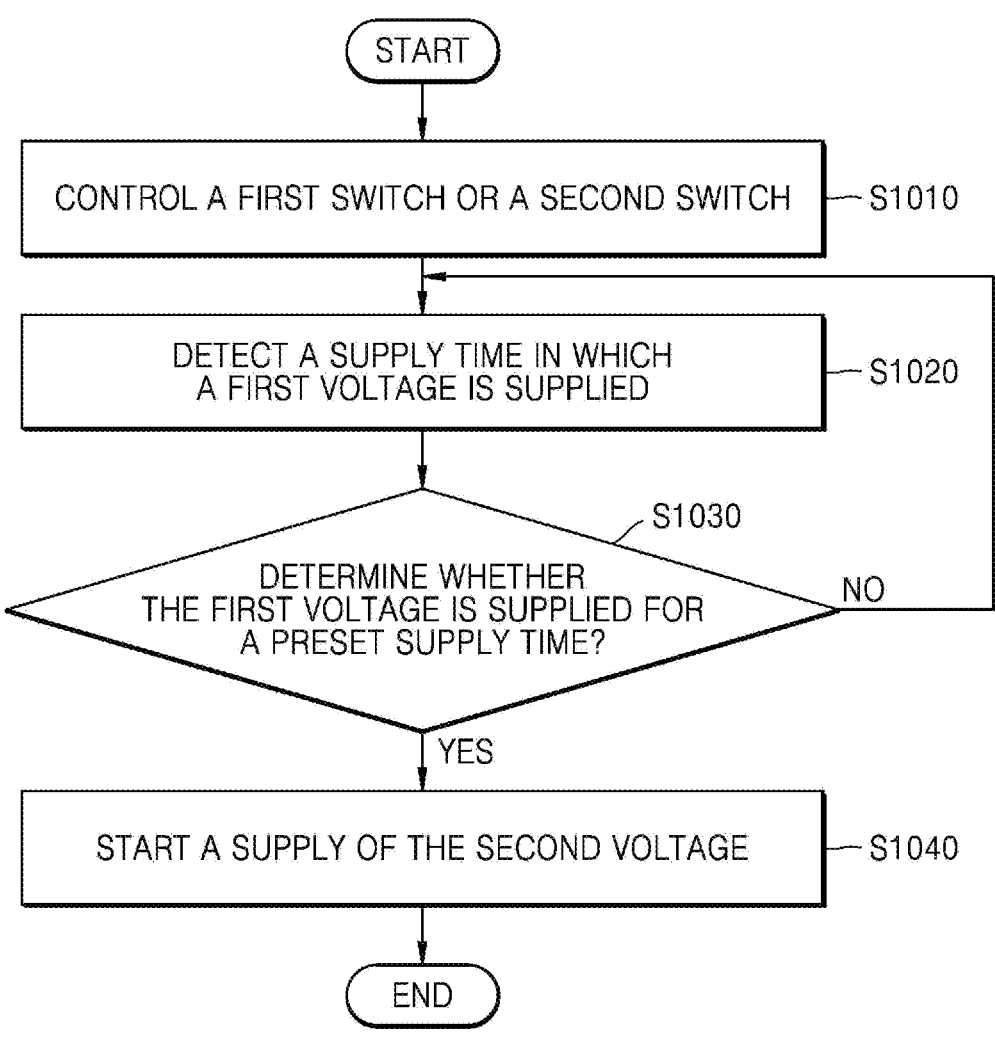
FIG. 10 is a flowchart showing a process of supplying a second voltage depending on a preset time in an operating method of a memory device according to an embodiment.

FIG. 10 is a flowchart showing a process of supplying the second voltage depending on a preset time in a method of operating a memory device according to an embodiment.

Referring to FIG. 10, the memory device 10 according to an embodiment may control the first switch 120 and the second switch 140 to charge at least one selected word line or at least one selected bit line, which is selected among a plurality of word lines or a plurality of bit lines by using a plurality of charging terminals (S1010).

In an embodiment, the memory device 10 may detect a supply time in which the first voltage VPPL is supplied (S1020). For example, the memory device 10 may include the counter 180*b* and may detect the supply time in which the first voltage VPPL is supplied or the second voltage VPPX is supplied.

In an embodiment, when the first voltage VPPL is supplied, the memory device 10 may determine whether the first voltage VPPL is supplied for the preset supply time (S1030). For example, the preset supply time may be a time interval for which the selected word line or the selected bit line has the same voltage as the first voltage VPPL but is not limited thereto.

When the first voltage VPPL is determined to be supplied for the preset supply time, the memory device 10 may start the supply of the second voltage VPPX (S1040). When the first voltage VPPL is determined to be supplied to the at least one selected word line or the at least one selected bit line for the preset supply time, the memory device 10 may start the supply of the second voltage VPPX, and thus, the memory block 200 may be charged based on the second voltage VPPX. In an embodiment, when the preset supply time is not sufficient for the time when the at least one selected word line or the at least one selected bit line has the same voltage as the first voltage VPPL, the voltage supply circuit 100 may supply the second voltage VPPX until a voltage of the at least one selected word line or the at least one selected bit line satisfies the second reference condition. For example, the second reference condition may be set as a state that a selected word line or a selected bit line for the charging, which is selected among the plurality of word lines or the plurality of bit lines, has the same voltage as the second voltage VPPX.

However, when the first voltage VPPL has not been supplied for the preset supply time, the memory device 10 may continue to detect an actual supply time for which the first voltage VPPL is supplied.

Figure 11:
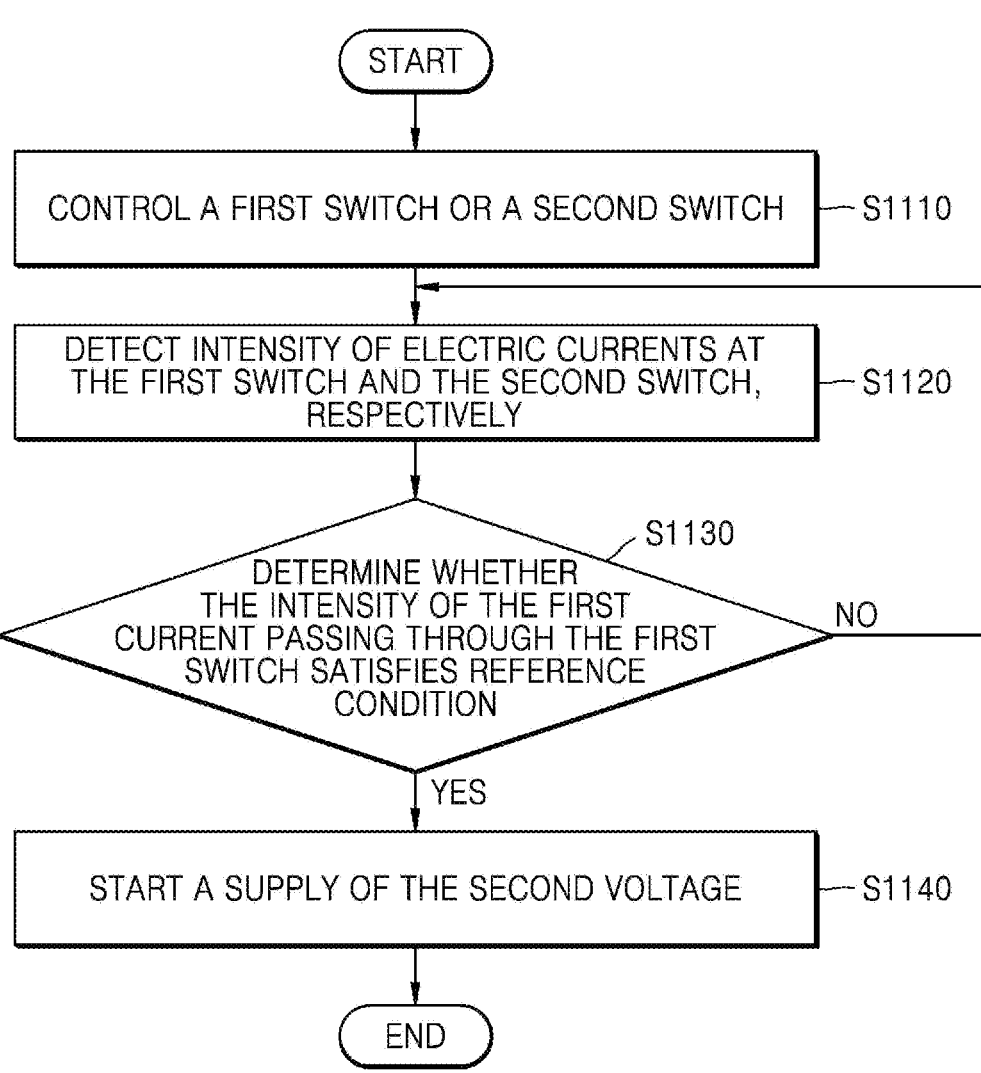
FIG. 11 is a flowchart showing a process of supplying a second voltage depending on a preset intensity of current in an operating method of a memory device according to an embodiment.

FIG. 11 is a flowchart showing a process of supplying the second voltage depending on a preset intensity of current in a method of operating a memory device according to an embodiment.

Referring to FIG. 11, the memory device 10 according to an embodiment may control the first switch 120 and the second switch 140 to charge at least one selected word line or at least one selected bit line, which is selected among a plurality of word lines or a plurality of bit lines, by using a plurality of charging terminals (S1110).

In an embodiment, the memory device 10 may detect the intensity of the electric current at the first switch 120 and the second switch 140 (S1120).

In an embodiment, once the intensity of the electric current is individually detected at the first switch 120 and the second switch 140, the memory device 10 may determine whether the intensity of the first current detected at the first switch satisfies a preset reference (S1130). In an embodiment, the first current may be an electric current that is generated by the first voltage VPPL and passes through the first switch 120.

When the intensity of the first current satisfies the preset reference, the memory device 10 may start the supply of the second voltage VPPX (S1140). However, when the intensity of the first current does not satisfy the preset reference, the memory device 10 may continue to detect the intensity of the current at the first switch 120 and the second switch 140.

Figure 12:
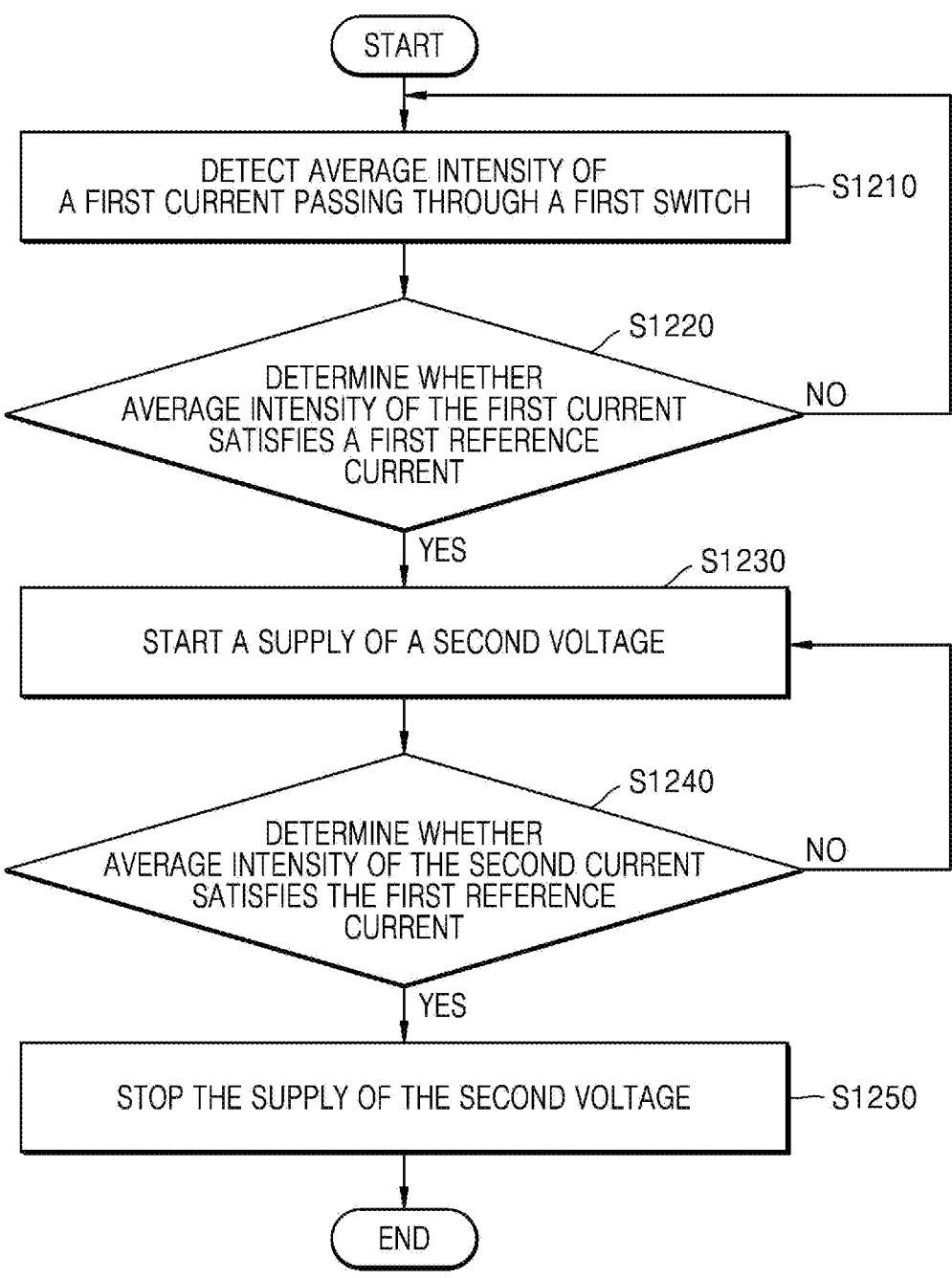
FIGS. 12 and 13 are flowcharts showing a process of stopping the supply of a second voltage depending on current intensity in an operating method of a memory device, according to an embodiment.
Figure 13:
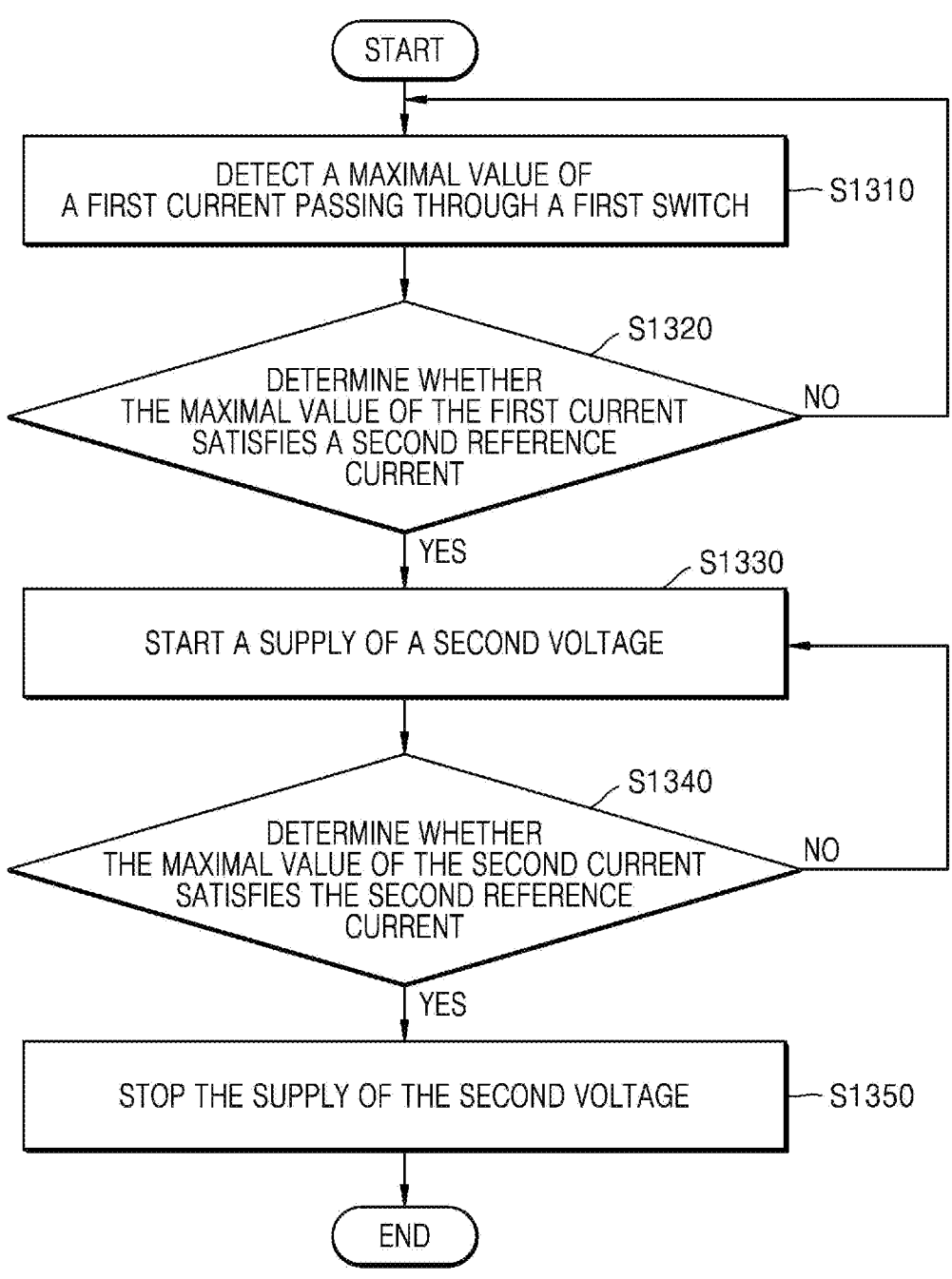

FIGS. 12 and 13 are flowcharts showing a process of stopping the supply of the second voltage depending on current intensity in a method of operating a memory device, according to an embodiment.

Referring to FIG. 12, the memory device 10 according to an embodiment may detect an average intensity of the first current passing through the first switch 120 (S1210).

When the average intensity of the first current passing through the first switch 120 is detected, the memory device 10 may determine whether the average intensity of the first current satisfies a first reference current (S1220).

In an embodiment, the first reference current may be a value at which the supply amount of the first voltage VPPL or the second voltage VPPX, which is determined based on the average intensity of the first current or the second current, satisfies the first reference condition or the second reference condition, respectively. In an embodiment, the memory device 10 may be configured to supply the second voltage VPPX when the average intensity of the first current is determined to satisfy the first reference current. For example, the memory device 10 may determine that the first voltage VPPL is sufficiently supplied in such a degree that the first reference condition is satisfied by the detecting results of the average intensity of the first current, and then, may start the supply of the second voltage VPPX. In an embodiment, the memory device 10 may determine the supply amount of the first voltage VPPL based on the average intensity of the first current.

When the average intensity of the first current is determined to satisfy the first reference current, the memory device 10 may start the supply of the second voltage VPPX (S1230). For example, the voltage supply circuit 100 may determine that the first voltage VPPL is sufficiently supplied in such a degree that the first reference condition is satisfied by the detecting results of the average intensity of the first current, and then, may start the supply of the second voltage VPPX. In an embodiment, the voltage supply circuit 100 may determine the supply amount of the first voltage VPPL based on the average intensity of the first current.

However, when the average intensity of the first current does not satisfy the first reference current, the memory device 10 may continue to detect the average intensity of the current passing through the first switch 120.

When the supply of the second voltage VPPX is initiated, the memory device 10 may determine whether average intensity of the second current satisfies the first reference current (S1240). In an embodiment, the second current may be an electric current generated by the second voltage VPPX and passing through the second switch 140.

When the average intensity of the second current is determined to satisfy the first reference current, the memory device 10 may stop the supply of the second voltage VPPX (S1250).

When the supply of the first voltage VPPL is stopped and the selected word line or the selected bit line is charged based on the second voltage VPPX, the memory device 10 may determine that the second voltage VPPX is sufficiently supplied in such a degree that the second reference condition is satisfied by the detecting results of the average intensity of the second current, and may stop the supply of the second voltage VPPX. In an embodiment, the memory device 10 may determine the supply amount of the second voltage VPPX based on the average intensity of the second current.

However, when the average intensity of the second current does not satisfy the first reference current, the memory device 10 may continue to supply the second voltage VPPX.

Referring to FIG. 13, the memory device 10 may detect a maximum value of the first current passing through the first switch 120 (S1310). In an embodiment, the first current may be an electric current generated based on the first voltage VPPL and passing through the first switch 120. In an embodiment, the second current may be an electric current generated based on the second voltage VPPX and passing through the second switch 140.

When the maximum value of the first current passing through the first switch 120 is detected, the memory device 10 may determine whether the maximum value of the first current satisfies a second reference current (S1320).

The second reference current may be a value at which the supply amount of the first voltage VPPL or the second voltage VPPX, which is determined based on the maximum (or peak) intensity of the first current or the second current, satisfies the first reference condition or the second reference condition, respectively.

When the maximum value of the first current satisfies the second reference current, the memory device 10 may start the supply of the second voltage VPPX (S1330). However, when the maximum value of the first current does not satisfy the second reference current, the memory device 10 may continue to detect the maximum value of the first current passing through the first switch 120.

When the supply of the second voltage VPPX is initiated, the memory device 10 may determine whether a maximum value of the second current satisfies a second reference current (S1340).

When the maximum value of the second current satisfies the second reference current, the memory device 10 may stop the supply of the second voltage VPPX (S1350). However, when the maximum value of the second current does not satisfy the second reference current, the memory device 10 may continue to supply the second voltage VPPX.

Figure 14:
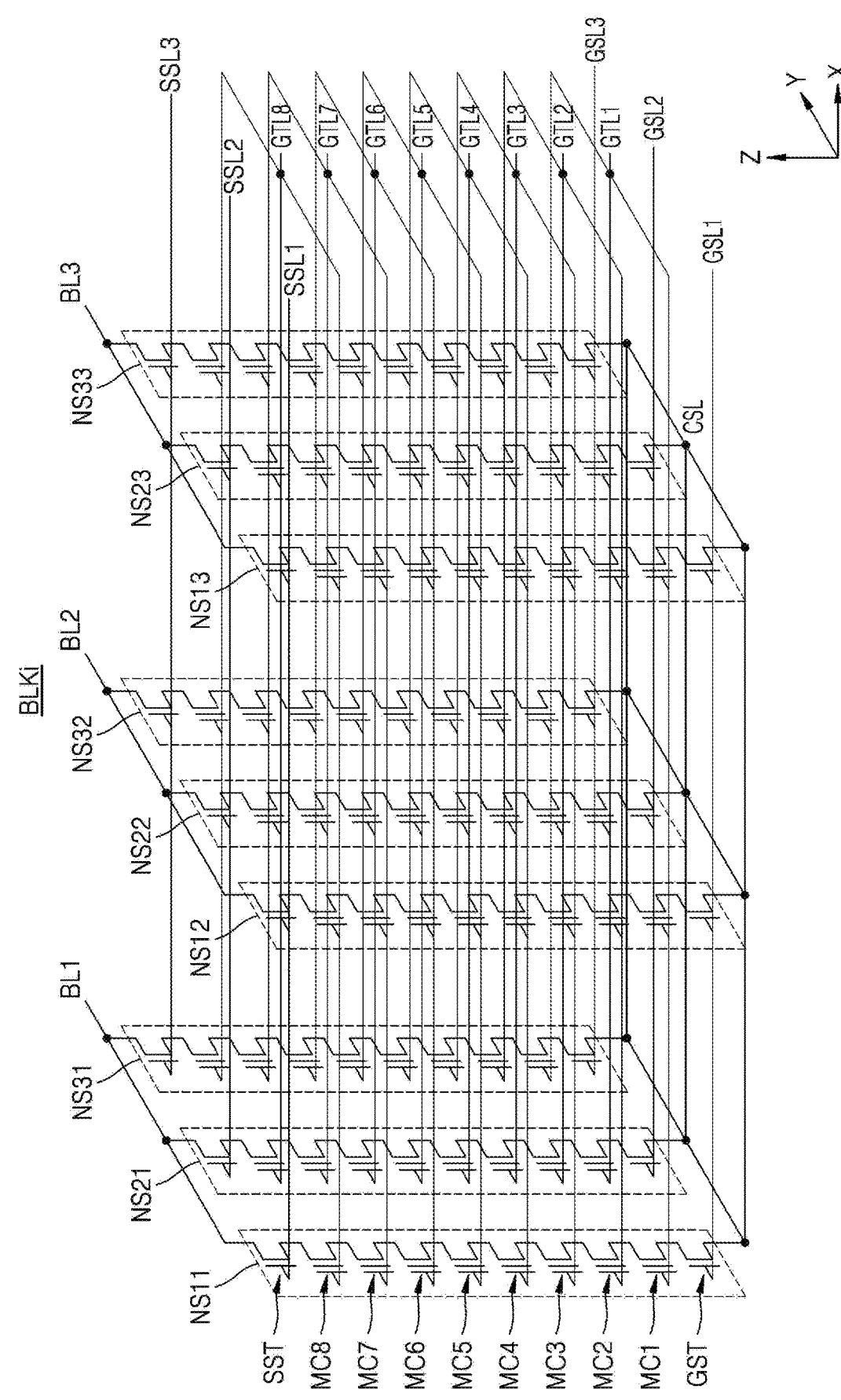
Figure 15:
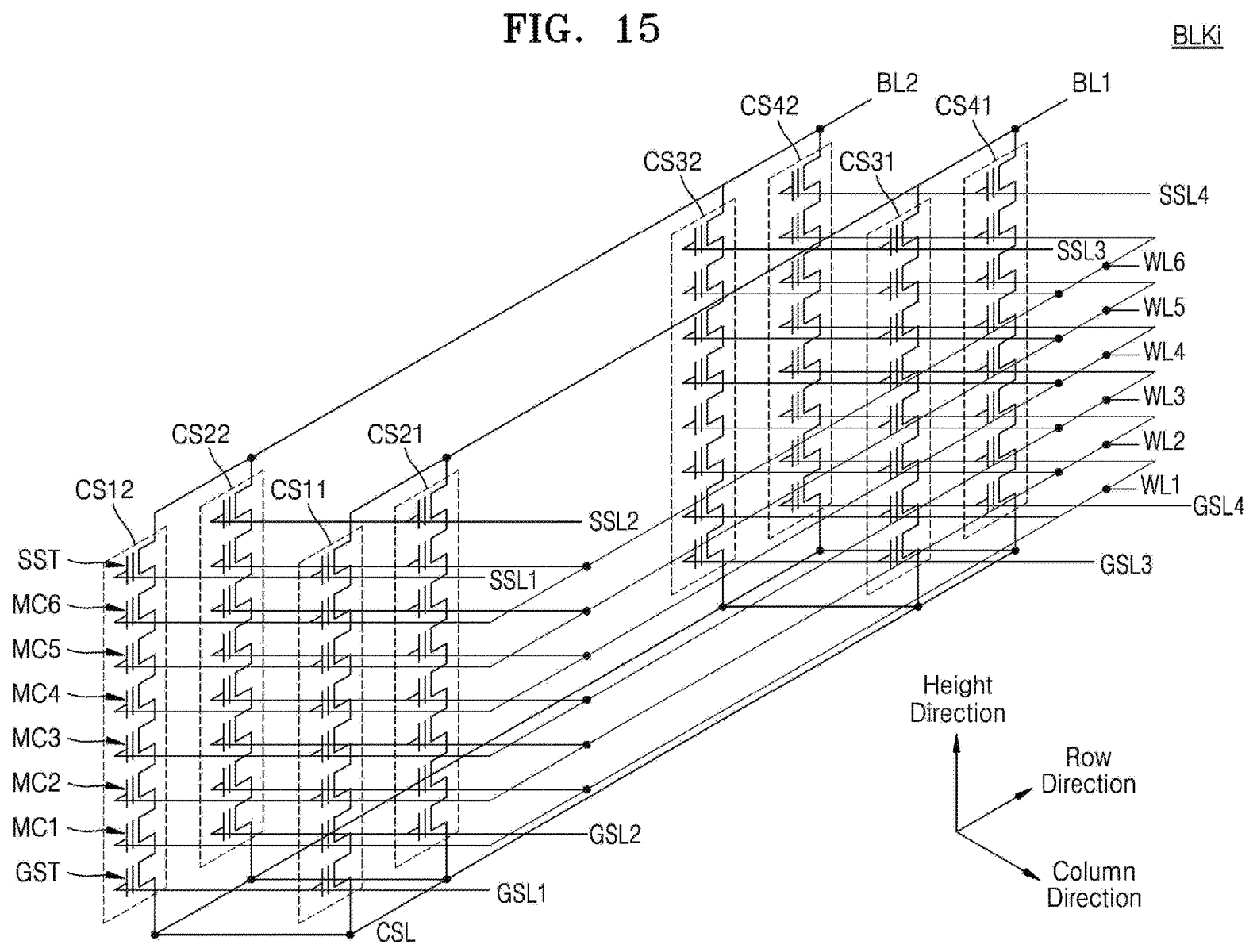

FIGS. 14 and 15 are views illustrate the memory block of the memory device, according to an embodiment.

Referring to FIG. 14, the memory block BLKi may include a plurality of memory NAND strings NS11 to NS33 that are positioned between bit lines BL1, BL2, and BL3 and a common source line CSL and electrically connected therebetween. Each of the memory NAND strings NS11 to NS33 may include a string selection transistor SST, a plurality of memory cells MC1 to MC8, and a ground selection transistor GST. For simplicity of the drawing, each of the memory NAND strings NS11 to NS33 is illustrated to include eight memory cells MC1 to MC8 in FIG. 10, but the number of the memory cells in each NAND strings NS11 to NS33 is not limited thereto.

The string selection transistor SST may be connected to one of string selection lines SSL1, SSL2, and SSL3 corresponding thereto. Each of the plurality of memory cells MC1 to MC8 may be connected to gate lines GTL1 to GTL8 corresponding thereto. The gate lines GTL1 to GTL8 may be provided as word lines, and a portion of the gate lines GTL1 to GTL8 may be provided as dummy word lines. The ground selection transistor GST may be connected to one of ground selection lines GSL1, GSL2, and GSL3 corresponding thereto. The string selection transistor SST may be connected to one of the bit lines BL1, BL2, and BL3 corresponding thereto, and the ground selection transistor GST may be connected to the common source line CSL.

Gate lines of the same height (e.g., GTL1) are commonly connected, and ground selection lines GSL1, GSL2, and GSL3 and string selection lines SSL1, SSL2, and SSL3 may be separated, respectively. The memory block BLK is illustrated to include eight gate lines GTL1 to GTL8 and three bit lines BL1, BL2, and BL3 in FIG. 10, but the number of the gate lines and the bit lines in the memory block BLK is not limited thereto.

Referring to FIG. 15, the memory block BLKi may include a plurality of cell strings CS11 to CS41 and CS12 to CS42. The plurality of cell strings CS11 to CS41 and CS12 to CS42 may be arranged in a row direction and a column direction to form rows and columns.

Each cell string may include a ground selection transistor GST, a plurality of memory cells MC1 to MC6, and a string selection transistor SST. In each cell string, the ground selection transistor GST, the plurality of memory cells MC1 to MC6, and the string selection transistor SST may be stacked in a height direction perpendicular to the substrate.

The plurality of cell strings CS11 to CS41 and CS12 to CS42 may be connected to different string selection lines SSL1 to SSL4 by the row. For example, the string selection transistors SST of the cell strings CS11 and CS12 may be commonly connected to the string selection line SSL1. The string selection transistors SST of the cell strings CS21 and CS22 may be commonly connected to the string selection line SSL2. The string selection transistors SST of the cell strings CS31 and CS32 may be commonly connected to the string selection line SSL3. The string selection transistors SST of the cell strings CS41 and CS42 may be commonly connected to the string selection line SSL4.

The plurality of cell strings CS11 to CS41 and CS12 to CS42 may be connected to different bit lines BL1 and BL2 by the column. For example, the string selection transistors SST of the cell strings CS11 to CS41 may be commonly connected to the bit line BL1. The string selection transistors SST of the cell strings CS12 to CS42 may be commonly connected to the bit line BL2.

The plurality of cell strings CS11 to CS41 and CS12 to CS42 may be connected to different ground selection lines GSL1 to GSL4 by the row. For example, the ground selection transistors GST of the cell strings CS11 and CS12 may be commonly connected to the ground selection line GSL1. The ground selection transistors GST of the cell strings CS21 and CS22 may be commonly connected to the ground selection line GSL2. The ground selection transistors GST of the cell strings CS31 and CS32 may be commonly connected to the ground selection line GSL3. The ground selection transistors GST of the cell strings CS41 and CS42 may be commonly connected to the ground selection line GSL4.

A plurality of memory cells, which are positioned at the same height from the substrate (or the ground selection transistors GST), may be commonly connected to a single word line, and a plurality of memory cells, which are positioned at different heights, may be individually connected to different word lines WL1 to WL6, respectively. For example, the memory cells MC1 may be commonly connected to the word line WL1. The memory cells MC2 may be commonly connected to the word line WL2. The memory cells MC3 may be commonly connected to the word line WL3. The memory cells MC4 may be commonly connected to the word line WL4. The memory cells MC5 may be commonly connected to the word line WL5. The memory cells MC6 may be commonly connected to the word line WL6.

The ground selection transistors GST of the cell strings CS11 to CS41 and CS12 to CS42 may be commonly connected to the common source line CSL.

The memory block BLKi shown FIG. 2 is disclosed by example. The disclosure is not limited to the memory block BLKi shown in FIG. 2. For example, the number of rows of the cell strings may be increased or decreased. As the number of rows of cell strings changes, the number of string selection lines connected to the cell strings by the row and the number of cell strings connected to a single bit line may also change. As the number of rows of cell strings changes, the number of ground selection lines connected to the cell strings by the row may also change.

The number of columns of cell strings may be increased or decreased. As the number of columns of cell strings changes, the number of bit lines connected to the cell strings by the column and the number of cell strings connected to a single string selection line may also change.

The height of the cell strings may be increased or decreased. For example, the number of memory cells stacked on each of the cell strings may be increased or decreased. As the number of memory cells stacked on each of the cell strings is changed, the number of word lines may also change. For example, the number of string selection transistors or ground selection transistors in each of the cell strings may increase. As the number of string selection transistors or ground selection transistors in each cell string changes, the number of string selection lines or ground selection lines may also change. When the number of string selection transistors or ground selection transistors increases, the string selection transistors or the ground selection transistors may be stacked in the same form as the memory cells MC1 to MC6.

For example, the write operation and read operation in the memory block BLKi may be performed by the row of the cell strings CS11 to CS41 and CS12 to CS42. In an embodiment, the cell strings CS11 to CS41 and CS12 to CS42 may be selected by the rows by the ground selection lines GSL1 to GSL4, and the cell strings CS11 to CS41 and CS12 to CS42 may be selected by the row by string selection lines SSL1 to SSL4. In addition, the ground selection lines GSL1 to GSL4 may be grouped at least two GSL groups GSL1 to GSL2 and GSL3 to GSL4, the voltage may be applied to the ground selection lines by the GSL group. In contrast, the voltage may also be applied to a single group of the entire ground selection lines GSL1 to GSL4. In an embodiment, the ground selection lines GSL1 to GSL4 may be programmed to have a preset threshold voltage.

When a particular row of the cell strings CS11 to CS41 and CS12 to CS42 is selected, the write operation and the read operation may be performed by the page. The page may indicate a single row of the memory cells that are connected to a single word line. In a selected row of the cell strings CS11 to CS41 and CS12 to CS42, the memory cells may be selected by the page by selecting one of the plurality of word lines WL1 to WL6.

Figure 16:
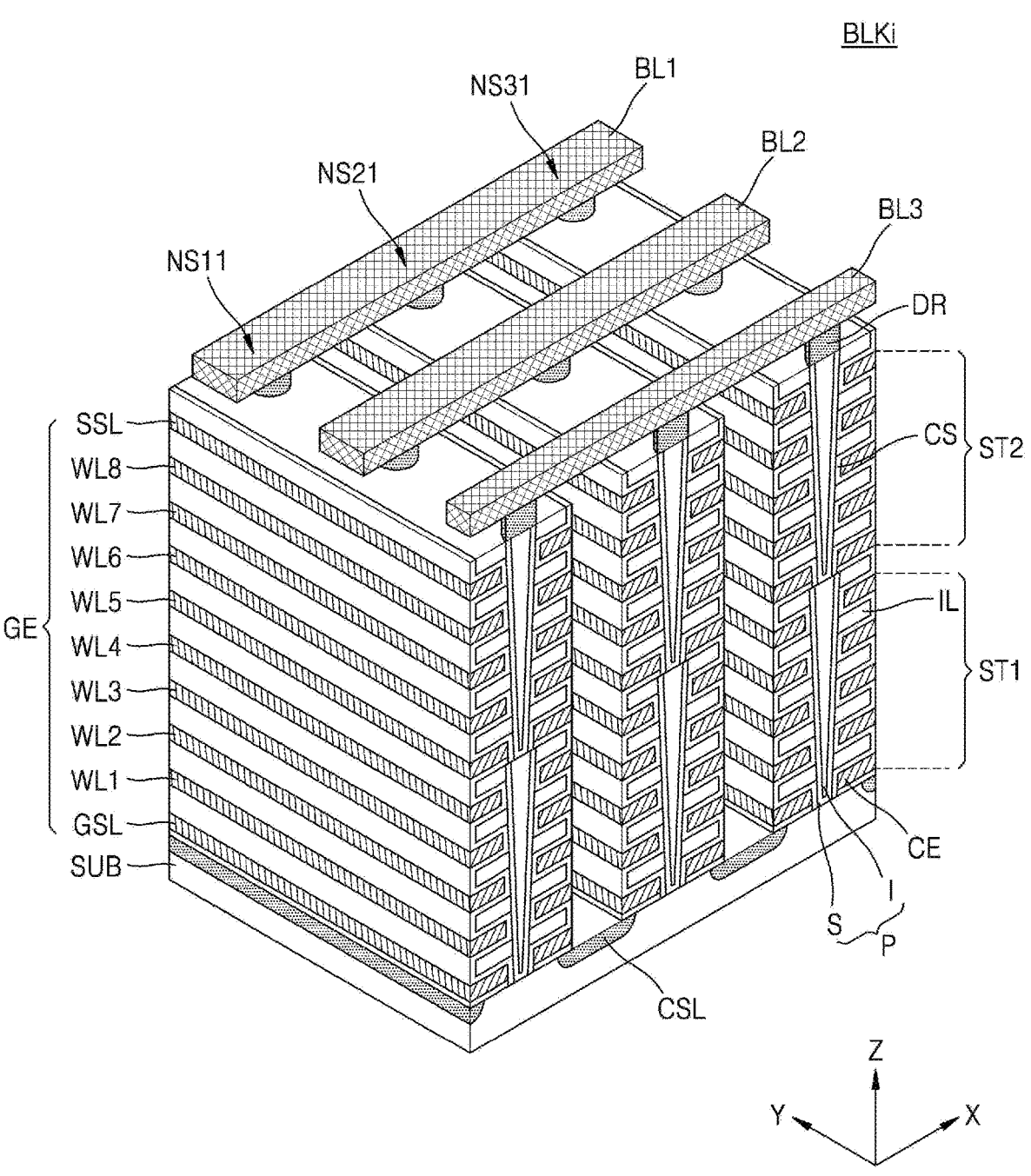
Figure 17:
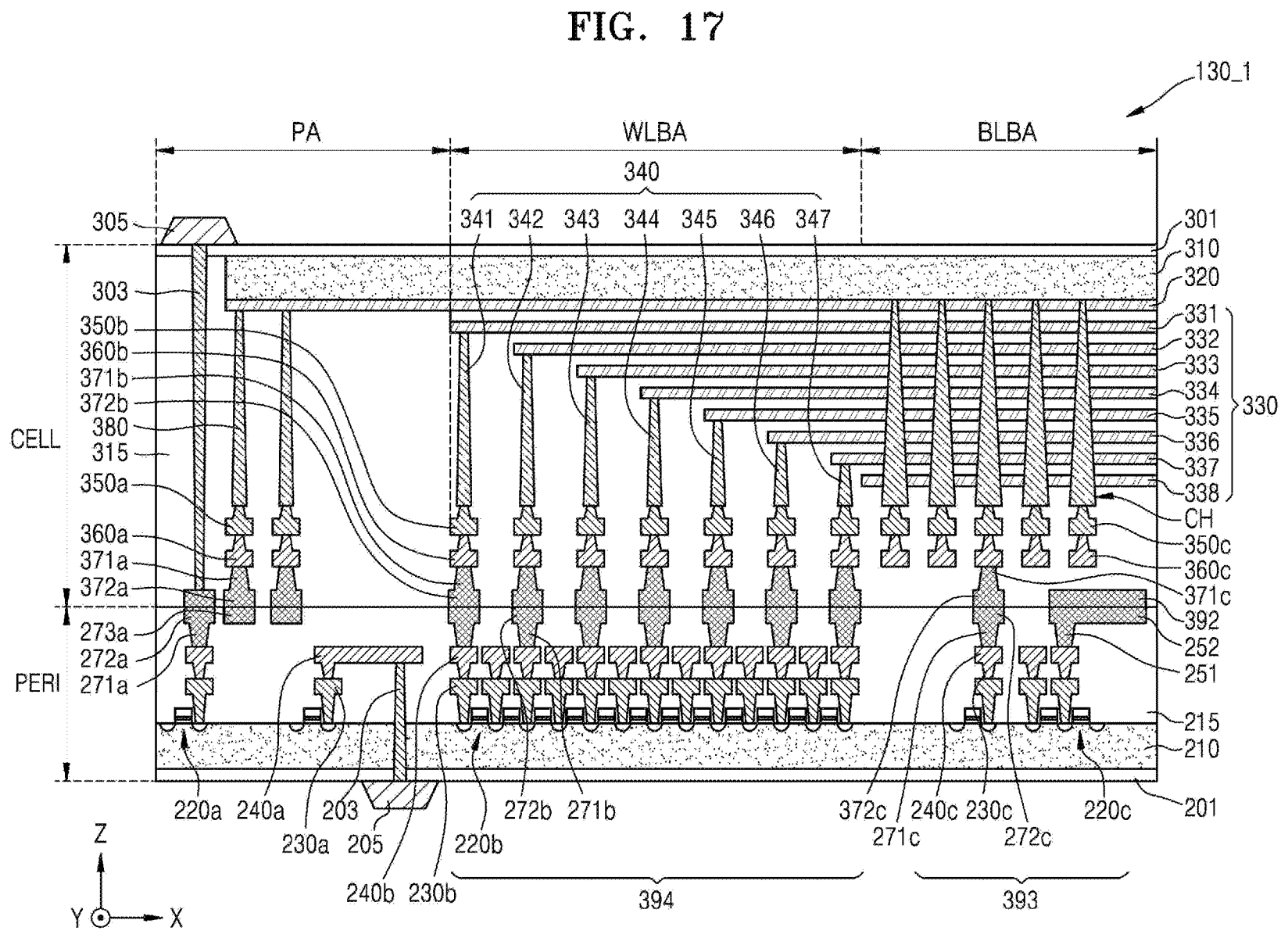

FIGS. 16 and 17 are views illustrating a 3-dimensional V-NAND structure applicable to the memory device, according to an embodiment.

A first nonvolatile memory applicable to the memory device 10 in FIG. 1 may include a plurality of memory blocks BLKi.

Referring to FIG. 16, the memory block BLKi may be formed on a substrate SUB in a direction perpendicular to the substrate SUB. A plurality of memory cells of the NAND memory strings NS11 to NS31 may be stacked on a plurality of semiconductor layers.

A common source line CSL may be provided on the substrate SUB and extend in the first direction (Y direction). A plurality of insulating layers IL may be provided on the substrate SUB between the two adjacent common source lines CSL in a shape of line extending in the first direction (Y direction) and may be sequentially stacked in the third direction (Z direction) with a specific distance therebetween. A plurality of pillars P may be arranged on the substrate SUB between the two adjacent common source lines CSL in the first direction (Y direction) and may penetrate through the stacked insulating layers IL in the third direction (Z direction). In an embodiment, the plurality of pillars P may make contact with substrate SUB. A surface layer S of each pillar P may include a silicon material doped with a first conductivity type and may function as a channel region.

An inner layer I of each pillar P may include an insulating material such as silicon oxide and air. A charge storage layer CS may be provided along an exposed surface of the insulating layers IL, the pillars P, and the substrate SUB in the area between the two adjacent common source lines CSL. The charge storage layer CS may include a gate insulating layer (or referred to as tunneling insulating layer), a charge trap layer, and a blocking insulating layer. In addition, a plurality of gate electrodes such as the word lines WL1 to WL8 and a plurality of selection lines GSL and SSL may be provided on an exposed surface of the charge storage layer CS in the area between the two adjacent common source lines CSL. A drain electrode or a drain contact DR may be provided on each of the plurality of pillars P. A plurality of bit lines BL1 to BL3 contacting the drain contacts DR may be arranged in a shape of line extending in the second direction (X direction) and be spaced apart by a specific distance in the first direction (Y direction).

As shown in FIG. 16, each NAND memory string NS11 to NS33 may be configured to a structure in which a first memory stack ST1 and a second memory stack ST2 are stacked on the substrate SUB. In an embodiment, the first memory stack ST1 may be connected to the common source line CSL, and the second memory stack ST2 may be connected to the bit lines BL1 to BL3, while the first memory stack ST1 and the second memory stack ST2 are share a channel hole with each other.

Referring further to FIG. 17, the nonvolatile memory 130_1 may have a chip-to-chip (C2C) structure. An upper chip including a cell structure CELL may be formed on a first wafer and a lower chip including a peripheral circuit structure PERI may be formed on a second wafer different from the first wafer, and then, the upper chip and the lower chip may be bonded to each other by a bonding process, to thereby obtain the C2C structure. Thus, an upper bonding metal, which is formed on an uppermost metal layer of the upper chip, and a lower bonding metal, which is formed on an uppermost metal layer of the lower chip, are electrically connected with each other by the bonding process. For example, when the bonding metal includes copper (Cu), the bonding process may be referred to as Cu—Cu bonding, and the bonding metal may include any other metals such aluminum (Al) and tungsten (W).

In an embodiment, both of the peripheral circuit structure PERI and the cell structure CELL of the nonvolatile memory 130_1 may be arranged in an external pad bonding area PA, a word line bonding area WLBA, and a bit line bonding area BLBA.

In an embodiment, the peripheral circuit structure PERI may include a first substrate 210, an interlayer insulating layer 215, a plurality of circuit elements 220a, 220b, and 220c on the first substrate 210, a plurality of first metal layers 230a, 230b, and 230c connected to the plurality of circuit elements 220a, 220b, and 220c, respectively, and a plurality of second metal layers 240a, 240b, and 240c on the first metal layers 230a, 230b, and 230c. In an embodiment, the first metal layers 230a, 230b, and 230c may include tungsten (W) having relatively high specific resistance, and the second metal layers 240a, 240b, and 240c may include copper (Cu) having relatively low specific resistance.

Although only the first metal layers 230a, 230b, 230c and the second metal layers 240a, 240b, and 240c are disclosed and explained herein, which is not limit the disclosure, and at least one additional metal layer may be further provided on the second metal layers 240a, 240b, and 240c. In an embodiment, the additional metal layer on the second metal layers 240a, 240b, and 240c may include a conductive material such as aluminum (Al) having specific resistance lower than copper (Cu) that comprises the second metal layer 240a, 240b, and 240c.

The interlayer insulating layer 215 may be positioned on the first substrate 210 to cover a plurality of circuit elements 220a, 220b, and 220c, the first metal layers 230a, 230b, and 230c, and the second metal layers 240a, 240b, and 240c, and may include an insulating material such as silicon oxide, silicon nitride, etc.

The lower bonding metals 271b and 272b may be provided on the second metal layer 240b in the word line bonding area WLBA. The lower bonding metals 271b and 272b of the peripheral circuit structure PERI may be electrically connected to the upper bonding metals 371b and 372b of the cell structure CELL in the word line bonding area WLBA by the bonding process, and the lower bonding metals 271b and 272b and the upper bonding metals 371b and 372b may include aluminum (Al), copper (Cu), or tungsten (W), etc.

The cell structure CELL may be provided as at least one memory block. The cell structure CELL may include a second substrate 310 and a common source line 320. A plurality of word lines 331 to 338 or 330 may be stacked on the second substrate 310 in a direction (Z-axis direction) perpendicular to an upper surface of the second substrate 310. A string selection line may be arranged over the word lines 330 and a ground selection line may be arranged below the word lines 330, so that a plurality of word lines 330 may be positioned between the string selection line and the ground selection line.

In the bit line bonding area BLBA, a channel structure CH may extend through the word lines 330, the string selection line and the ground selection line in a direction (Z direction) substantially perpendicular to an upper surface of the second substrate 310. The channel structure CH may include a data storage layer, a channel layer, a buried insulating layer, and the like, and the channel layer may be electrically connected to the first metal layer 350c and the second metal layer 360c. For example, the first metal layer 350c may include a bit line contact, and the second metal layer 360c may include a bit line. In an embodiment, the bit line 360c may extend in the first direction (Y direction) in parallel with the upper surface of the second substrate 310.

The area in which the channel structure CH and the bit line 360c are positioned may be provided as the bit line bonding area BLBA. The bit line 360c may be electrically connected to the circuit elements 220c, which are provided as the page buffer 393 of the peripheral circuit structure PERI, in the bit line bonding area BLBA. For example, the bit line 360c may be connected to the upper bonding metals 371c and 372c of the peripheral circuit structure PERI, and the upper bonding metals 371c and 372c may be bonded to the lower bonding metals 271c and 272c that are connected to the circuit elements 220c of the page buffer 393.

In the word line bonding area WLBA, the word lines 330 may extend in the second direction (X-axis direction) perpendicular to the first direction in parallel with the upper surface of the second substrate 310 and may be connected to a plurality of cell contact plugs 341 to 347 or 340. The word lines 330 and the cell contact plugs 340 may be connected to each other in contact pads, respectively, that are provided an extension of at least some of the word lines 330 in different lengths in the second direction. A first metal layer 350b and a second metal layer 360b may be sequentially connected to upper portions of the cell contact plugs 340 that are connected to the word lines 330. The cell contact plugs 340 may be connected to the peripheral circuit structure PERI in the word line bonding area WLBA by the bonding of the upper bonding metals 371b and 372b of the cell structure CELL and the lower bonding metals 271b and 272b of the peripheral circuit structure PERI.

The cell contact plugs 340 may be electrically connected to the circuit elements 220b, which comprises a row decoder 394 of the peripheral circuit structure PERI. In an embodiment, the operating voltage of the circuit elements 220b for the row decoder 394 may be different from the operating voltage of the circuit elements 220c for a page buffer 393. For example, the operating voltage of the circuit elements 220c for the page buffer 393 may be greater than the operating voltage of the circuit elements 220b for the row decoder 394.

A common source line contact plug 380 may be positioned in the external pad bonding area PA. The common source line contact plug 380 may include a conductive material such as metal, metal compound, and polysilicon, and may be electrically connected to the common source line 320. A first metal layer 350a and a second metal layer 360a may be sequentially stacked on an upper portion of the common source line contact plug 380. Herein, an area in which the common source line contact plug 380, the first metal layer 350a, and the second metal layer 360a are arranged may be provided as the external pad bonding area PA.

In addition, first and second input/output pads 205 and 305 may be arranged in the external pad bonding area PA. A lower insulating layer 201 covering a lower surface of the first substrate 210 may be formed on the lower surface of the first substrate 210, and the first input/output pad 205 may be formed on the lower insulating layer 201. The first input/output pad 205 may be connected to at least one of the plurality of circuit elements 220a, 220b, and 220c of the peripheral circuit structure PERI via the first input/output contact plug 203, and may be separated from the first substrate 210 by the lower insulating layer 201. In addition, a side insulating layer may be positioned between the first input/output contact plug 203 and the first substrate 210, and thus, the first input/output contact plug 203 may be electrically separated from the first substrate 210.

An upper insulating layer 301 covering an upper surface of the second substrate 310 may be formed on the upper surface of the second substrate 310, and the second input/output pad 305 may be positioned on the upper insulating layer 301. The second input/output pad 305 may be connected to at least one of the plurality of circuit elements 220a, 220b, and 220c of the peripheral circuit structure PERI via the second input/output contact plug 303. In an embodiment, the second input/output pad 305 may be electrically connected to the circuit element 220a.

In another embodiment, the second substrate 310 and the common source line 320 may not be positioned in the area where the second input/output contact plug 303 is positioned. In addition, the second input/output pad 305 may not overlap the word lines 330 in the third direction (Z-axis direction). The second input/output contact plug 303 may be separated from the second substrate 310 in a direction in parallel with the upper surface of the second substrate 310 and may be connected to the second input/output pad 305 penetrating through the interlayer insulating layer 315 of the cell structure CELL.

In some embodiments, the first input/output pad 205 and the second input/output pad 305 may be selectively provided with the nonvolatile memory 110. For example, the non-volatile memory 130_1 may include only the first input/output pad 205 on the upper portion of the first substrate 210 or only the second input/output pad 305 on the upper portion of the second substrate 310. In contrast, the nonvolatile memory 130_1 may include both of the first input/output pad 205 and the second input/output pad 305.

In the cell structure CELL of the external pad bonding area PA and the bit line bonding area BLBA and the peripheral circuit structure PERI of the external pad bonding area PA and the bit line bonding area BLBA, metal patterns of uppermost metal layers may be provided as dummy patterns or no uppermost metal layer may be provided.

A lower metal pattern 273a may be provided in the uppermost metal layer of the peripheral circuit structure PERI correspondently to the upper metal pattern 372a in the same configurations as an upper metal pattern 372a, which is provided in the uppermost metal layer of the cell structure CELL, in the external pad bonding area PA of the nonvolatile memory 130_1. The lower metal pattern 273a, which is provided in the uppermost metal layer of the peripheral circuit structure PERI, may not be connected to a separate contact. Similarly, the upper metal pattern 373a may be provided in the uppermost metal layer of the cell structure CELL correspondently to the lower metal pattern 273a in the same configurations as the lower metal pattern 273a, which is provided in the uppermost metal layer of the peripheral circuit structure PERI, in the external pad bonding area PA of the nonvolatile memory 110.

The lower bonding metals 271b and 272b may be provided on the second metal layer 240b of the word line bonding area WLBA. In the word line bonding area WLBA, the lower bonding metals 271b and 272b of the peripheral circuit structure PERI may be electrically connected to the upper bonding metals 371b and 372b of the cell structure CELL by the bonding process.

In addition, the upper metal pattern 392 may be provided in the uppermost metal layer of the cell structure CELL correspondently to the lower metal pattern 252 in the same configurations as the lower metal pattern 252, which is provided in the uppermost metal layer of the peripheral circuit structure PERI, in the external pad bonding area PA of the nonvolatile memory 110. No contact may be provided with the upper metal pattern 392 that is provided in the uppermost metal layer of the cell area CELL.

The above description is merely an example of the technical idea of this specification, and a person skilled in the art to which the disclosed embodiments belong will be able to correct and modify various disclosed embodiments without departing from the essential characteristics of the invention. Therefore, the disclosed embodiments are not for limiting the technical idea described herein but for explaining, and the scope of the technical idea of the invention is not limited by the disclosed embodiments. The scope of protection of the invention according to the disclosed embodiments should be interpreted by the following claims, and all technical ideas within the scope equivalent thereto should be interpreted as being included in the scope of the disclosed invention.

The above description is merely an example of the technical idea of this specification, and a person skilled in the art to which the disclosed embodiments belong will be able to correct and modify various disclosed embodiments without departing from the essential characteristics of the invention. Therefore, the disclosed embodiments are not for limiting the technical idea described herein but for explaining, and the scope of the technical idea of the invention is not limited by the disclosed embodiments. The scope of protection of the invention according to the disclosed embodiments should be interpreted by the following claims, and all technical ideas within the scope equivalent thereto should be interpreted as being included in the scope of the disclosed invention.

While the disclosure has been particularly shown and described with reference to embodiments thereof, it will be understood that various changes in form and details may be made therein without departing from the spirit and scope of the following claims.

What is claimed is:

1. A memory device comprising:
a first charging terminal configured to supply a first voltage and a first current to at least one word line or at least one bit line; and
a second charging terminal configured to supply a second voltage and a second current to the at least one word line or the at least one bit line,
wherein the second charging terminal is configured to start supplying the second voltage and the second current based on a charged voltage of the at least one word line or the at least one bit line, charged with the first voltage, satisfying a first reference condition, and
wherein the second charging terminal is configured to supply the second voltage and the second current based on an intensity of the first current being determined to satisfy a reference current.

2. The memory device of claim 1, wherein the second voltage is greater than the first voltage.

3. The memory device of claim 1, further comprising:
a first switch connected to the first charging terminal; and
a second switch connected to the second charging terminal,
wherein, based on the charged voltage of the at least one word line or the at least one bit line that is charged with the first voltage and determined to satisfy the first reference condition, the first switch is configured to be changed to an open state, and the second switch is configured to be changed to a closed state.

4. The memory device of claim 1, further comprising a counter configured to count a supply time of the first voltage,
wherein the second charging terminal is configured to supply the second voltage based on the supply time of the first voltage counted by the counter satisfying a reference supply time.

5. The memory device of claim 3, further comprising a current sensor configured to detect an intensity of an electric current passing through the first switch and the second switch, wherein the second charging terminal is configured to supply the second voltage based on the intensity of the first current passing through the first switch being determined to satisfy the reference current.

6. The memory device of claim 5, wherein the second charging terminal is configured to supply the second voltage based on an average intensity of the first current being determined to satisfy a first reference current.

7. The memory device of claim 5, wherein the second charging terminal is configured to stop supplying the second voltage based on an average intensity of the second current passing through the second switch being determined to satisfy a first reference current.

8. The memory device of claim 5, wherein the second charging terminal is configured to start supplying the second voltage based on a maximum value of the first current being determined to satisfy a second reference current.

9. The memory device of claim 5, wherein the second charging terminal is configured to stop supplying the second voltage based on a maximum value of the second current passing through the second switch being determined to satisfy a second reference current.

10. An operating method of a memory device, the method comprising:
   supplying, by a first charging terminal, a first voltage and a first current to at least one word line or at least one bit line;
   supplying, by a second charging terminal, a second voltage and a second current to the at least one word line or the at least one bit line;
   detecting an intensity of the first current; and
   supplying the second voltage and the second current based on the first current being determined to satisfy a reference current,
   wherein the supplying of the second voltage and the second current starts based on a charged voltage of the at least one word line or the at least one bit line, charged with the first voltage, satisfying a first reference condition.

11. The method of claim 10, further comprising setting the second voltage as a value greater than the first voltage.

12. The method of claim 10, further comprising controlling a first switch connected to the first charging terminal and a second switch connected to the second charging terminal such that, based on the charged voltage of the at least one word line or the at least one bit line being determined to satisfy the first reference condition, the first switch is changed to an open state, and the second switch is changed to a closed state.

13. The method of claim 10, further comprising:
   detecting a supply time of the first voltage; and
   controlling the second voltage to be supplied based on the supply time of the first voltage being determined to satisfy a reference supply time.

14. The method of claim 12, further comprising:
   detecting an intensity of electric currents passing through the first switch and the second switch.

15. The method of claim 14, wherein the detecting of the intensity of the electric currents passing through the first switch and the second switch comprises detecting an average intensity of the first current, and
   wherein the supplying of the second voltage comprises starting the supplying of the second voltage based on the average intensity of the first current being determined to satisfy a first reference current.

16. The method of claim 14, wherein the detecting of the intensity of the electric currents passing through the first switch and the second switch comprises detecting an average intensity of the second current passing through the second switch, and
   wherein the supplying of the second voltage comprises stopping the supplying of the second voltage based on the average intensity of the second current being determined to satisfy a first reference current.

17. The method of claim 14, wherein the detecting of the intensity of the electric currents passing through the first switch and the second switch comprises detecting a maximum value of the first current, and
   wherein the supplying of the second voltage comprises starting the supplying of the second voltage based on the maximum value of the first current being determined to satisfy a second reference current.

18. The method of claim 14, wherein the detecting of the intensity of the electric currents passing through the first switch and the second switch comprises detecting a maximum value of the second current passing through the second switch, and
   wherein the supplying of the second voltage comprises stopping the supplying of the second voltage based on the maximum value of the second current being determined to satisfy a second reference current.

19. A voltage supply circuit of a memory device, the voltage supply circuit comprising:
   a first charging terminal configured to supply a first voltage from outside to at least one word line or at least one bit line;
   a second charging terminal configured to supply a second voltage from outside to the at least one word line or the at least one bit line,
   wherein the second charging terminal is configured to start supplying the second voltage based on a charged voltage of the at least one word line or the at least one bit line, charged with the first voltage, satisfying a first reference condition.

20. The voltage supply circuit of claim 19, wherein the second voltage has a value greater than the first voltage.

* * * * *